(12) United States Patent
Yoo et al.

(10) Patent No.: US 12,216,878 B2
(45) Date of Patent: *Feb. 4, 2025

(54) DISPLAY DEVICE AND ELECTRONIC DEVICE HAVING THE SAME

(71) Applicant: Samsung Display Co., Ltd., Yongin-si (KR)

(72) Inventors: Bugyoon Yoo, Hwaseong-si (KR); Yunjae Kim, Cheonan-si (KR); Chang-Kil Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/204,553

(22) Filed: Jun. 1, 2023

(65) Prior Publication Data

US 2023/0305669 A1  Sep. 28, 2023

Related U.S. Application Data

(63) Continuation of application No. 17/708,722, filed on Mar. 30, 2022, now Pat. No. 11,698,704.

(30) Foreign Application Priority Data

Jun. 14, 2021  (KR) .................. 10-2021-0077031

(51) Int. Cl.
*G06F 3/046* (2006.01)
*G06F 3/041* (2006.01)
(Continued)

(52) U.S. Cl.
CPC ............ *G06F 3/046* (2013.01); *G06F 3/0412* (2013.01); *H05K 9/0054* (2013.01);
(Continued)

(58) Field of Classification Search
CPC .................. G06F 3/046; G06F 3/0412; G06F 2203/04107; G06F 2203/04106;
(Continued)

(56) References Cited

U.S. PATENT DOCUMENTS 9,678,604 B2   6/2017  Lee
10,976,873 B2  4/2021  Shin et al.
(Continued)

FOREIGN PATENT DOCUMENTS

KR       101750564 B1    6/2017
KR     1020180114796 A  10/2018
(Continued)

*Primary Examiner* — Jimmy H Nguyen
(74) *Attorney, Agent, or Firm* — CANTOR COLBURN LLP

(57) ABSTRACT

A display device includes a display panel and a lower member disposed under the display panel. The lower member includes a support layer, a digitizer, a flexible circuit board, and a metal layer. The digitizer is disposed under the support layer having an insulating property. The flexible circuit board is connected to the digitizer. The metal layer is disposed under the digitizer, and an opening is defined through the metal layer to correspond to the flexible circuit board.

20 Claims, 14 Drawing Sheets

(51) Int. Cl.
*H05K 1/18* (2006.01)
*H05K 9/00* (2006.01)
*H10K 59/131* (2023.01)
*H10K 59/40* (2023.01)
*H10K 77/10* (2023.01)
*H10K 102/00* (2023.01)

(52) U.S. Cl.
CPC ............ *G06F 2203/04102* (2013.01); *G06F 2203/04106* (2013.01); *G06F 2203/04107* (2013.01); *H05K 1/189* (2013.01); *H05K 2201/10128* (2013.01); *H05K 2201/10151* (2013.01); *H10K 59/131* (2023.02); *H10K 59/40* (2023.02); *H10K 77/111* (2023.02); *H10K 2102/311* (2023.02)

(58) Field of Classification Search
CPC .......... G06F 2203/04102; H10K 59/40; H10K 59/65; H10K 59/131; H10K 77/111; H10K 2102/311; H05K 9/0054; H05K 1/189; H05K 2201/10128; H05K 2201/10151
USPC ........................................... 345/173, 174, 76
See application file for complete search history.

(56) References Cited

U.S. PATENT DOCUMENTS

| | | | |
|---|---|---|---|
| 10,983,558 | B2 | 4/2021 | Kim et al. |
| 11,243,564 | B2 | 2/2022 | Kim et al. |
| 11,281,346 | B2 | 3/2022 | Hirotsugu et al. |
| 11,698,704 | B2* | 7/2023 | Yoo ................... H10K 59/65 345/174 |
| 2018/0293420 | A1 | 10/2018 | Kim et al. |
| 2020/0209998 | A1 | 7/2020 | Shin et al. |
| 2020/0227494 | A1* | 7/2020 | Bae ................. H10K 59/126 |
| 2020/0319672 | A1 | 10/2020 | Kim et al. |
| 2020/0401275 | A1 | 12/2020 | Shin et al. |
| 2021/0175462 | A1 | 7/2021 | Shin et al. |
| 2022/0149337 | A1* | 5/2022 | Horiuchi ............... G06F 1/1652 |

FOREIGN PATENT DOCUMENTS

| | | |
|---|---|---|
| KR | 1020200084495 A | 7/2020 |
| KR | 1020200108754 A | 9/2020 |
| KR | 1020210000359 A | 1/2021 |
| KR | 1020210016258 A | 2/2021 |
| KR | 1020210016983 A | 2/2021 |

* cited by examiner

DISPLAY DEVICE AND ELECTRONIC DEVICE HAVING THE SAME

This application is a continuation of U.S. patent application Ser. No. 17/708,722, filed on Mar. 30, 2022, which claims priority to Korean Patent Application No. 10-2021-0077031, filed on Jun. 14, 2021, and all the benefits accruing therefrom under 35 U.S.C. § 119, the content of which in its entirety is herein incorporated by reference.

BACKGROUND

1. Field

The disclosure relates to a display device and an electronic device including the display device. More particularly, the disclosure relates to a foldable display device and an electronic device including the foldable display device.

2. Description of the Related Art

A display device typically includes a display area that is activated in response to electrical signals. The display device may sense an input applied thereto from an outside through the display area and displays images to provide a user with information through the display area. In recent years, as the display devices of a variety of shapes are being developed, the display areas are designed in various shapes.

SUMMARY

The disclosure provides a display device including a digitizer with improved sensing sensitivity.

The disclosure provides an electronic device including the display device.

An embodiment of the invention provides a display device including a display panel and a lower member disposed under the display panel. In such an embodiment, the display panel includes a first non-folding area, a second non-folding area, and a folding area disposed between the first non-folding area and the second non-folding area. In such an embodiment, the lower member includes a support layer overlapping at least the first non-folding area and the second non-folding area and having an insulating property, a first digitizer disposed under the support layer, including a loop coil, and overlapping the first non-folding area, a second digitizer disposed under the support layer, including a loop coil, and overlapping the second non-folding area, a first flexible circuit board electrically connected to the first digitizer and disposed under the first digitizer, a second flexible circuit board electrically connected to the second digitizer and disposed under the second digitizer, a first metal layer disposed under the first digitizer, where a first opening is defined through the first metal layer to correspond to the first flexible circuit board, and a second metal layer disposed under the second digitizer, where a second opening is defined through the second metal layer to correspond to the second flexible circuit board.

In an embodiment, the support layer may include a reinforced fiber composite.

In an embodiment, the support layer may include a first support portion corresponding to the first non-folding area, a second support portion corresponding to the second non-folding area, and a folding portion disposed between the first support portion and the second support portion, where a plurality of openings may be defined through the folding portion.

In an embodiment, the lower member may further include a barrier layer overlapping the folding portion, the first support portion, and the second support portion, a first adhesive layer which attaches the barrier layer to an upper surface of the first support portion and an upper surface of the second support portion, a second adhesive layer which attaches a lower surface of the first support portion to the first digitizer, and a third adhesive layer which attaches a lower surface of the second support portion to the second digitizer.

In an embodiment, the display device may further include a cover layer attached to a lower surface of the folding portion and spaced apart from the first digitizer and the second digitizer.

In an embodiment, the first adhesive layer may include a first portion attached to the upper surface of the first support portion and a second portion attached to the upper surface of the second support portion and spaced apart from the first support portion.

In an embodiment, the lower member may further include a panel protective layer disposed between a lower surface of the display panel and the barrier layer.

In an embodiment, each of the first metal layer and the second metal layer may include copper.

In an embodiment, the lower member may further include a first metal plate disposed under the first metal layer, where a third opening may be defined through the first metal plate to correspond to the first opening and a second metal plate disposed under the second metal layer, where a fourth opening may be defined through the second metal plate to correspond to the second opening.

In an embodiment, the first metal layer may have an electrical conductivity greater than an electrical conductivity of the first metal plate.

In an embodiment, the first metal plate may have a thickness greater than a thickness of the first metal layer and a strength greater than a strength of the first metal layer.

In an embodiment, the lower member may further include a first heat dissipation layer disposed under the first metal plate and a second heat dissipation layer disposed under the second metal plate.

In an embodiment, a through hole may be defined through the support layer, the first digitizer, and the first metal layer of the lower member.

An embodiment of the invention provides an electronic device including a display device including a sensing area through which an optical signal passes and a display area adjacent to the sensing area and an electro-optical module disposed under the display device and overlapping the sensing area, where the electro-optical module receives the optical signal. In such an embodiment, the display device includes a display panel overlapping the sensing area and the display area and a lower member disposed under the display panel, where a portion of the display panel is foldable with respect to a folding axis. In such an embodiment, the lower member includes a support layer overlapping the sensing area and the display area and having an insulating property, a first digitizer disposed under the support layer, a second digitizer disposed under the support layer and spaced apart from the first digitizer in the portion of the display panel, a first flexible circuit board electrically connected to the first digitizer and disposed under the first digitizer, a second flexible circuit board electrically connected to the second digitizer and disposed under the second digitizer, a first metal layer disposed under the first digitizer where a first opening is defined through the first metal layer to correspond to the first flexible circuit board, and a second metal layer disposed under the second digitizer, where a second opening is defined through the second metal layer to correspond to the second flexible circuit board.

In an embodiment, a through hole may be defined through the support layer, the first digitizer, and the first metal layer of the lower member.

In an embodiment, the through hole may be aligned with the sensing area, and the electro-optical module may overlap the through hole.

In an embodiment, the electro-optical module may include a camera module.

In an embodiment, the display panel may include a first pixel disposed in the display area and a second pixel disposed in the sensing area.

In an embodiment, the display area may have a resolution higher than a resolution of the sensing area.

In an embodiment, a ratio of an area occupied by a light blocking structure to an entire area may be smaller in the sensing area than in the display area based on a unit area.

In an embodiment, the sensing area may include a non-transmission area in which a light emitting element is disposed and a transmission area in which the light emitting element is not disposed.

In an embodiment, the electronic device may further include a circuit board disposed under the first metal layer or the second metal layer and electrically connected to the first flexible circuit board and the second flexible circuit board.

According to embodiments, the support layer having an insulating property is disposed above the digitizer, such that the rate of shielding the electromagnetic field of the digitizer is reduced. Accordingly, the sensing sensitivity of the digitizer is improved.

In such embodiments, an opening is defined through the layers disposed under the digitizer to provide the connection path for the flexible circuit board connected to the digitizer. In such an embodiment, the layers disposed under the digitizer include metal layers, and the metal layers shield the electromagnetic wave generated from the electronic module disposed under the digitizer. In such embodiments, since the electromagnetic wave does not exert influence on the digitizer, the sensing sensitivity of the digitizer is improved.

In such embodiments, the metal plate enhances the strength in the lower side of the display device.

BRIEF DESCRIPTION OF THE DRAWINGS

The above and other features of the disclosure will become readily apparent by describing in further detail embodiments thereof with reference to the accompanying drawings, in which.

DETAILED DESCRIPTION

Figure 1A:
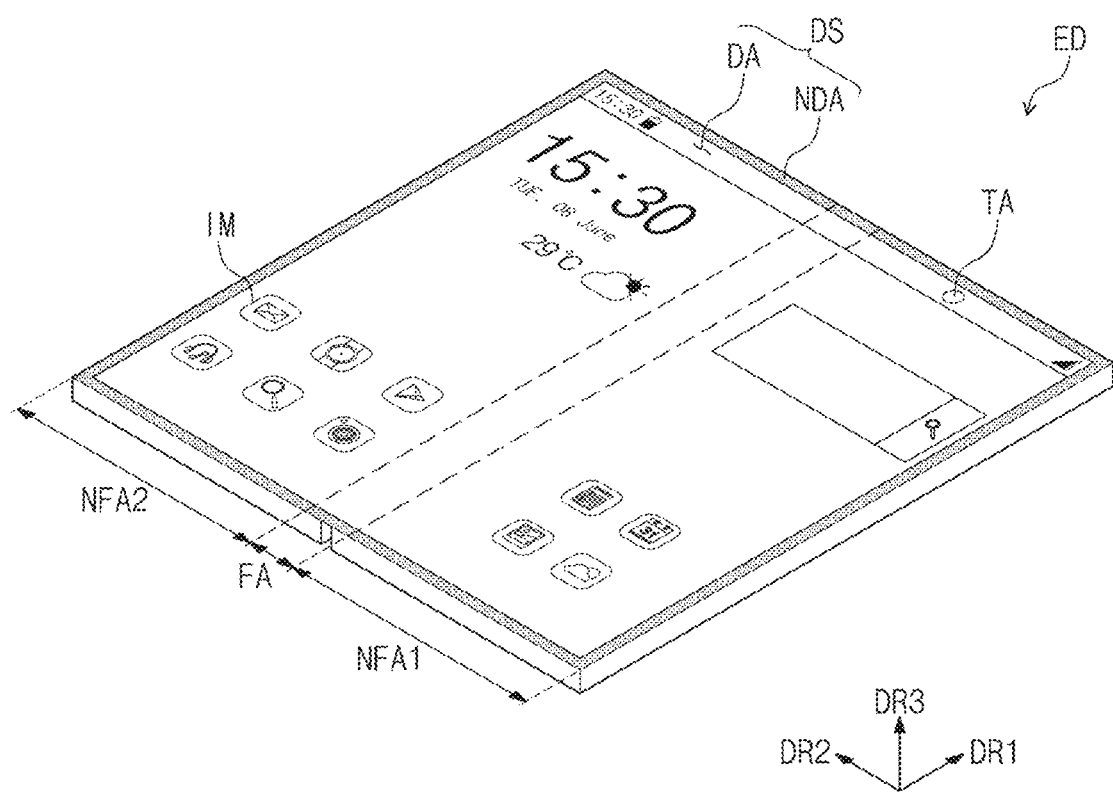
FIGS. 1A to 1C are perspective views showing an electronic device according to an embodiment of the disclosure.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

In the disclosure, it will be understood that when an element or layer is referred to as being "on", "connected to" or "coupled to" another element or layer, it can be directly on, connected or coupled to the other element or layer or intervening elements or layers may be present. In contrast, when an element is referred to as being "directly on" another element, there are no intervening elements present.

Like numerals refer to like elements throughout. In the drawings, the thickness, ratio, and dimension of components are exaggerated for effective description of the technical content.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the disclosure will be described in detail with reference to the accompanying drawings.

Figure 1B:
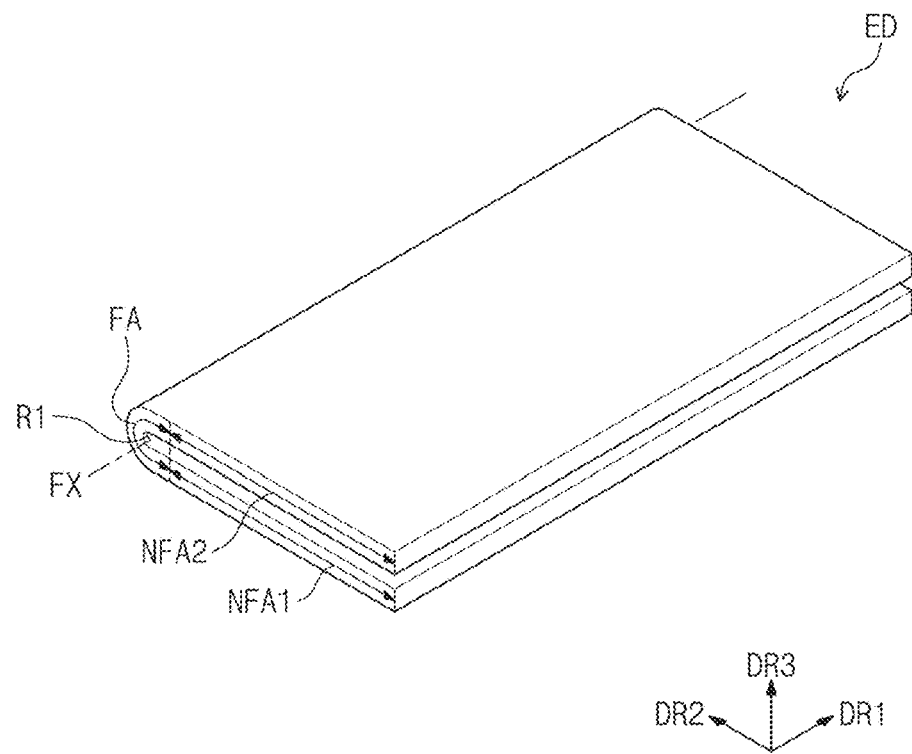
Figure 1C:
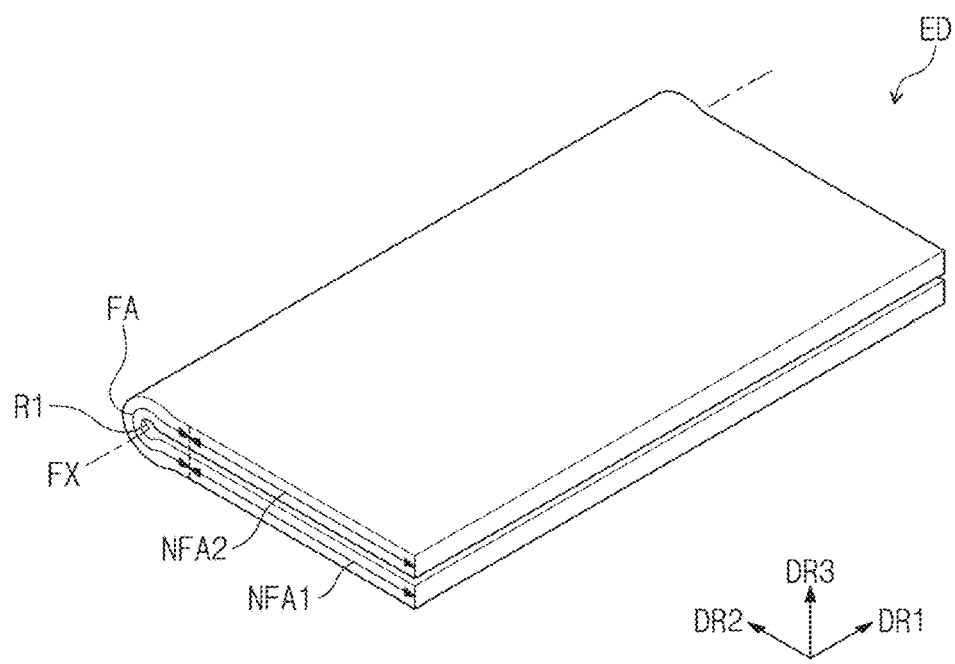

FIGS. 1A to 1C are perspective views showing an electronic device ED according to an embodiment of the disclosure. FIG. 1A shows an embodiment of the electronic device ED in an unfolded state, and FIGS. 1B and 1C show an embodiment of the electronic device ED in a folded state.

Referring to FIGS. 1A to 1C, an embodiment of the electronic device ED may include a display surface DS defined by a first direction DR1 and a second direction DR2 crossing the first direction DR1. The electronic device ED may provide an image IM to a user through the display surface DS.

The display surface DS may include a display area DA and a non-display area NDA around the display area DA. The display area DA may display the image IM, and the non-display area NDA may not display the image IM. The non-display area NDA may surround the display area DA, but not being limited thereto or thereby, and the shape of the display area DA and the shape of the non-display area NDA may be changed.

The display surface DS may include a sensing area TA. The sensing area TA may be a portion of the display area DA. The sensing area TA may have a transmittance higher than that of the other area of the display area DA. Hereinafter, the other area of the display area DA except the sensing area TA may be defined as an ordinary display area.

An optical signal, e.g., a visible light or an infrared light, may pass through the sensing area TA. The electronic device ED may take a picture of an external object using the visible light passing through the sensing area TA or may determine whether an external object is approaching using the infrared light. FIG. 1A shows an embodiment including a single sensing area TA, for example, however, the number of the sensing areas TA is not limited thereto or thereby. According to an embodiment, the sensing area TA may be provided in plural.

Hereinafter, a direction substantially perpendicular to a plane defined by the first direction DR1 and the second direction DR2 may be referred to as a third direction DR3. Front and lower surfaces of each member of the electronic device ED are distinguished from each other with respect to the third direction DR3. In the disclosure, the expression "when viewed in a plan view" may mean a state of being viewed in the third direction DR3. Hereinafter, the first, second, and third directions DR1, DR2, and DR3 are directions respectively indicated by first, second, and third directional axes, respectively, and are assigned with the same reference numerals as those of the first, second, and third directional axes.

An embodiment of the electronic device ED may include a folding area FA and a plurality of non-folding areas NFA1 and NFA2. The non-folding areas NFA1 and NFA2 may include a first non-folding area NFA1 and a second non-folding area NFA2. The folding area FA may be disposed between the first non-folding area NFA1 and the second non-folding area NFA2 in the second direction DR2.

In an embodiment, as shown in FIG. 1B, the folding area FA may be folded with respect to a folding axis FX substantially parallel to the first direction DR1. The folding area FA may have a predetermined curvature and a radius of curvature R1. The electronic device ED may be inwardly folded (inner-folding) such that the first non-folding area NFA1 faces the second non-folding area NFA2 and the display surface DS is not exposed to the outside.

According to an embodiment, the electronic device ED may be outwardly folded (outer-folding) such that the display surface DS is exposed to the outside. According to an embodiment, the electronic device ED may be provided such that the inner-folding operation or the outer-folding operation is repeated from an unfolding operation. According to an embodiment, the electronic device ED may perform any one of the unfolding operation, the inner-folding operation, and the outer-folding operation.

In an embodiment, as shown in FIG. 1B, a distance between the first non-folding area NFA1 and the second non-folding area NFA2 may be substantially the same as a distance corresponding to two times the radius of curvature R1 of the folding area FA, but not being limited thereto or thereby. As shown in FIG. 1C, the distance between the first non-folding area NFA1 and the second non-folding area NFA2 may be smaller than the distance corresponding to two times the radius of curvature R1 of the folding area FA.

Figure 2A:
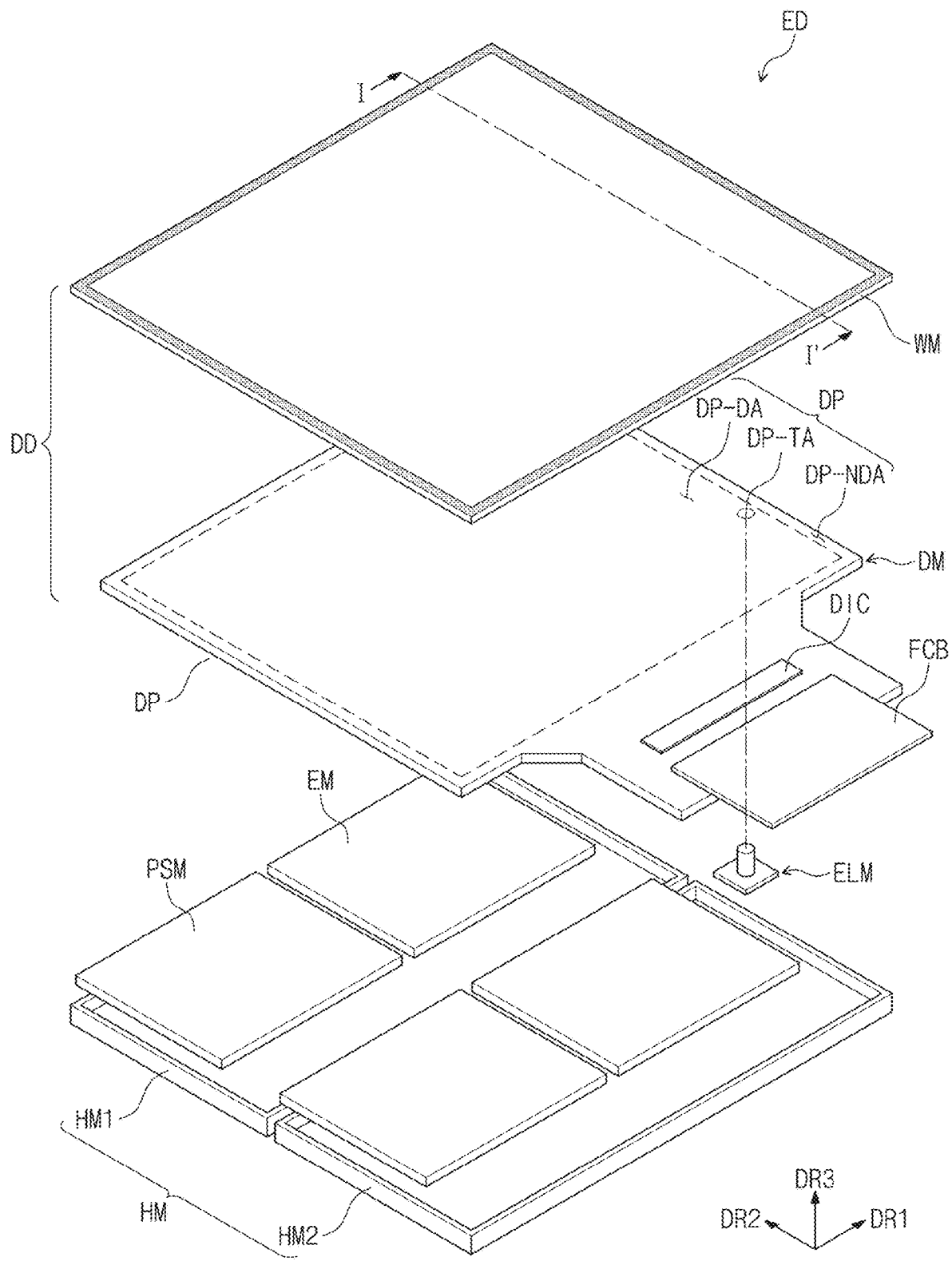
FIG. 2A is an exploded perspective view showing an electronic device according to an embodiment of the disclosure.
Figure 2B:
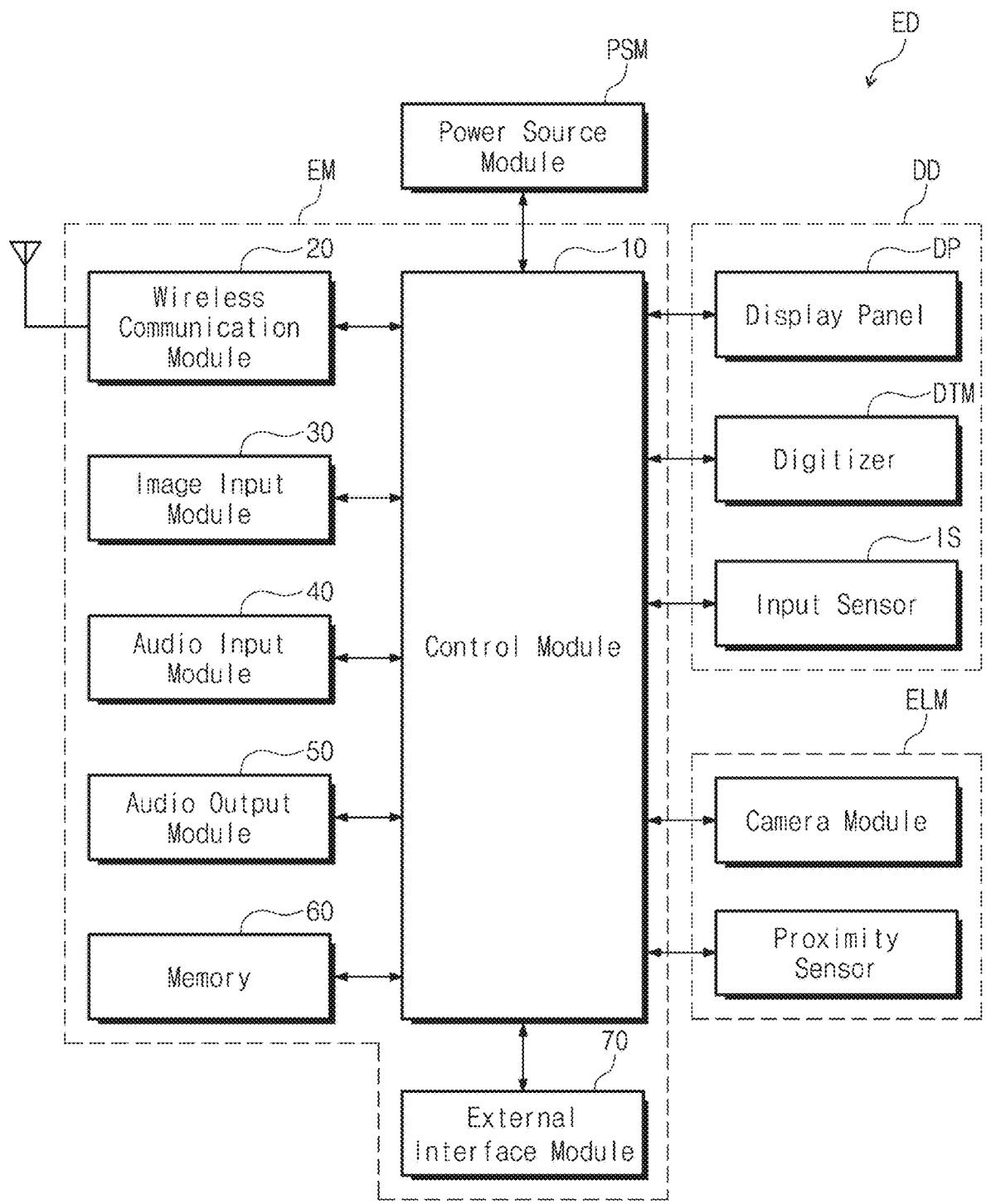
FIG. 2B is a block diagram showing an electronic device according to an embodiment of the disclosure.

FIG. 2A is an exploded perspective view showing the electronic device ED according to an embodiment of the disclosure. FIG. 2B is a block diagram showing the electronic device ED according to an embodiment of the disclosure.

Referring to FIGS. 2A and 2B, an embodiment of the electronic device ED may include a display device DD, an electronic module EM, an electro-optical module ELM, a power source module PSM, and a housing HM. Although not shown in figures, the electronic device ED may further include a mechanical structure to control a folding operation of the display device DD.

In an embodiment, the display device DD may generate an image and may sense an external input. The display device DD may include a window WM and a display module DM. The window WM may provide a front surface of the electronic device ED. The window WM will be described in detail later.

The display module DM may include at least a display panel DP. FIG. 2A shows only the display panel DP among components of the display module DM, which are stacked one on another, however, the display module DM may further include a plurality of components disposed above the display panel DP. A stack structure of the display module DM will be described later in greater detail.

In an embodiment, the display panel DP may be a light emitting type display panel, for example, an organic light emitting display panel or a quantum dot light emitting display panel, but not being particularly limited.

The display panel DP may include a display area DP-DA and a non-display area DP-NDA, which respectively correspond to the display area DA (refer to FIG. 1A) and the non-display area NDA (refer to FIG. 1A) of the electronic device ED. In the disclosure, the expression "an area/portion corresponds to another area/portion" means that "an area/portion overlaps another area/portion", however, the "areas and portions" may not be limited to have a same size as each other.

The display panel DP may include a sensing area DP-TA corresponding to the sensing area TA of FIG. 1A. The sensing area DP-TA may have a resolution lower than that of the display area DP-DA. The sensing area DP-TA will be described later in greater detail.

Referring to FIG. 2A, a driving chip DIC may be disposed in the non-display area DP-NDA of the display panel DP. A flexible circuit board FCB may be coupled with the non-display area DP-NDA of the display panel DP. The flexible circuit board FCB may be connected to a main circuit board. The main circuit board may be an electronic component constituting the electronic module EM.

The driving chip DIC may include driving elements to drive pixels of the display panel DP, e.g., a data driving circuit. FIG. 2A shows an embodiment having a structure in which the driving chip DIC is mounted on the display panel DP, however, the disclosure may not be limited thereto or thereby. In an alternative embodiment, for example, the driving chip DIC may be mounted on the flexible circuit board FCB.

In an embodiment, as shown in FIG. 2B, the display device DD may further include an input sensor IS and a digitizer DTM. The input sensor IS may sense a user input. A capacitive type input sensor IS may be disposed above the display panel DP. The digitizer DTM may sense an input generated by a stylus pen. An electromagnetic induction type digitizer DTM may be disposed under the display panel DP.

The electronic module EM may include a control module 10, a wireless communication module 20, an image input module 30, an audio input module 40, an audio output module 50, a memory 60, and an external interface module 70. The electronic module EM may include a main circuit board, and the modules may be mounted on the main circuit board or may be electrically connected to the main circuit board via a flexible circuit board. The electronic module EM may be electrically connected to the power source module PSM.

Referring to FIG. 2B, an embodiment of the electronic module EM may be disposed in each of a first housing HM1 and a second housing HM2, and the power source module PSM may be disposed in each of the first housing HM1 and the second housing HM2. Although not shown in figures, the electronic module EM disposed in the first housing HM1 and the electronic module EM disposed in the second housing HM2 may be electrically connected to each other via the flexible circuit board.

The control module 10 may control an overall operation of the electronic device ED. In an embodiment, for example, the control module 10 may activate or deactivate the display device DD in response to the user input. The control module 10 may control the image input module 30, the audio input module 40, and the audio output module 50 to meet the user input. The control module 10 may include at least one microprocessor.

The wireless communication module 20 may transmit/receive a wireless signal to/from other terminals using a Bluetooth® or WiFi® link. The wireless communication module 20 may transmit/receive a voice signal using a general communication line. The wireless communication module 20 may include a plurality of antenna modules.

The image input module 30 may process an image signal and may convert the image signal into image data that may be displayed through the display device DD. The audio input module 40 may receive an external audio signal through a microphone in a record mode or a voice recognition mode and may convert the external audio signal to electrical voice data. The audio output module 50 may convert the audio data provided from the wireless communication module 20 or the audio data stored in the memory 60 and may output the converted data to the outside.

The external interface module 70 may serve as an interface between the control module 10 and external devices, such as an external charger, a wired/wireless data port, a card socket (e.g., a memory card and a SIM/UIM card), etc.

The power source module PSM may supply a power source used for the overall operation of the electronic device ED. The power source module PSM may include a normal battery device.

The electro-optical module ELM may be an electronic component that outputs or receives an optical signal. The electro-optical module ELM may include a camera module and/or a proximity sensor. The camera module may take a picture of an external object via the sensing area DP-TA.

The housing HM shown in FIG. 2A may be coupled to the display device DD, particularly, the window WM to accommodate the above-mentioned modules. The housing HM may include the first and second housings HM1 and HM2 separated from each other, but not being limited thereto or thereby. Although not shown in figures, the housing HM may further include a hinge structure to connect the first and second housings HM1 and HM2 to each other.

Figure 3A:
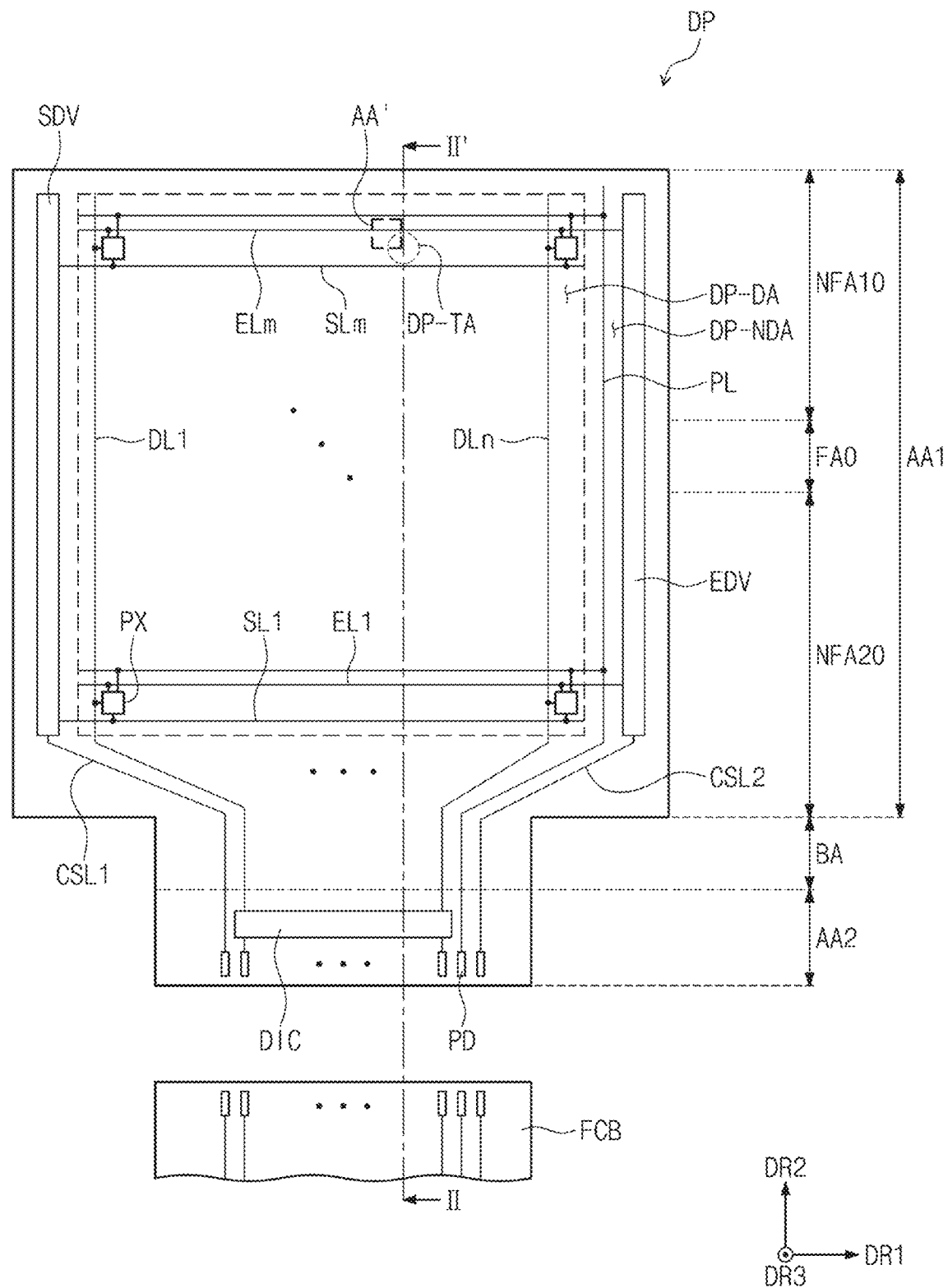
FIG. 3A is a plan view showing a display panel according to an embodiment of the disclosure.
Figure 3B:
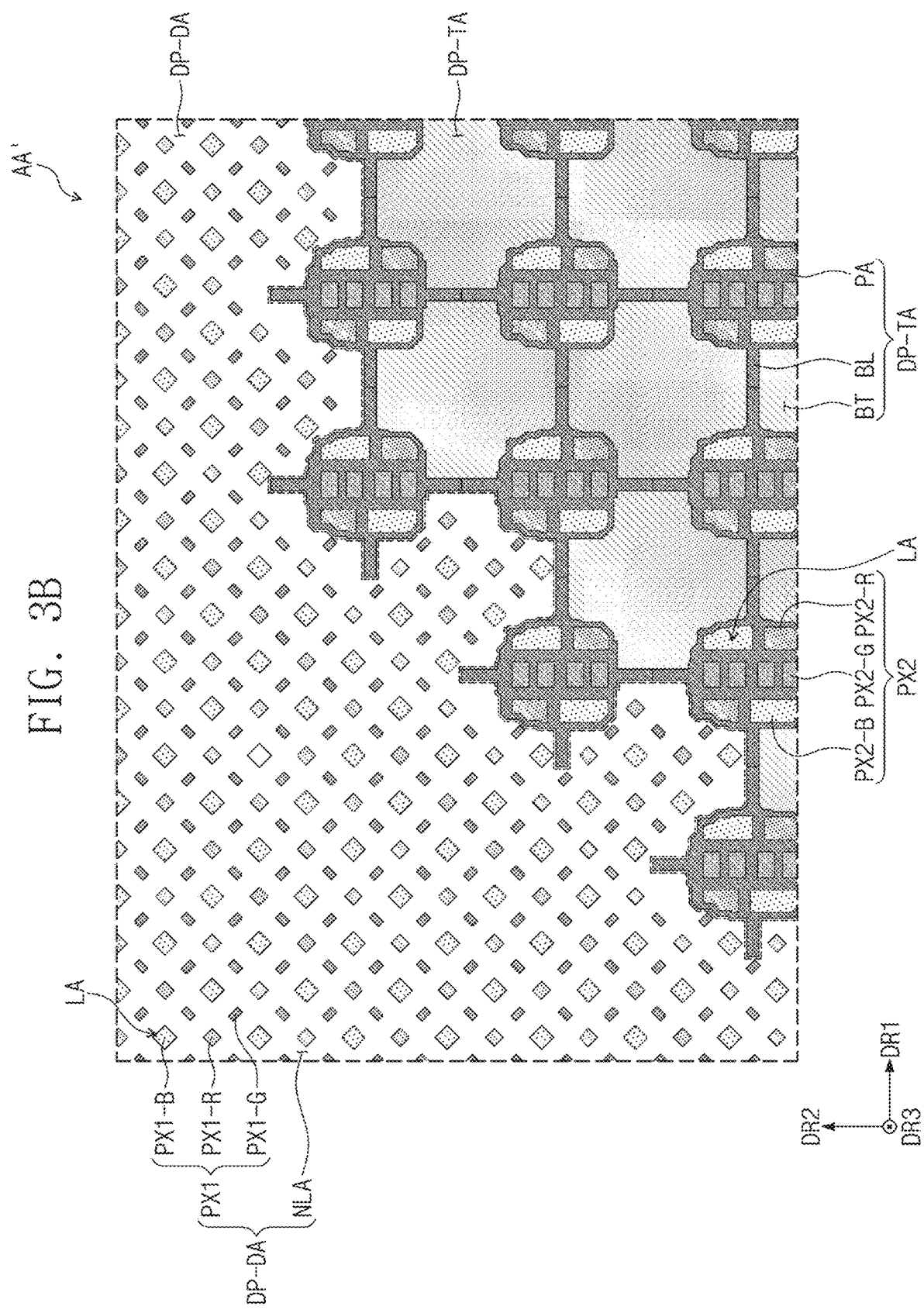
FIG. 3B is an enlarged plan view showing a portion of the display panel of FIG. 3A.

FIG. 3A is a plan view showing the display panel DP according to an embodiment of the disclosure, and FIG. 3B is an enlarged plan view showing a portion AA' of FIG. 3A.

Referring to FIG. 3A, an embodiment of the display panel DP may include the display area DP-DA and the non-display area DP-NDA around the display area DP-DA. The display area DP-DA and the non-display area DP-NDA may be distinguished from each other by the presence or absence of a pixel PX. The pixel PX may be disposed in the display area DP-DA. A scan driver SDV, a data driver, and an emission driver EDV may be disposed in the non-display area DP-NDA. The data driver may be a circuit provided in the driving chip DIC as shown in FIG. 3A.

The display panel DP may include a first area AA1, a second area AA2, and a bending area BA, which are distinct from each other in the second direction DR2. The second area AA2 and the bending area BA may be areas of the non-display area DP-NDA. The bending area BA may be defined between the first area AA1 and the second area AA2.

The first area AA1 may correspond to the display surface DS of FIG. 1A. The first area AA1 may include a first non-folding area NFA10, a second non-folding area NFA20, and a folding area FA0. The first non-folding area NFA10, the second non-folding area NFA20, and the folding area FA0 may respectively correspond to the first non-folding area NFA1, the second non-folding area NFA2, and the folding area FA of FIGS. 1A to 1C.

A length in the first direction DR1 of the bending area BA and the second area AA2 may be smaller than a length in the first direction DR1 of the first area AA1. An area having a relatively short length in a bending axis direction may be relatively easily bent.

The display panel DP may include a plurality of pixels PX, a plurality of scan lines SL1 to SLm, a plurality of data lines DL1 to DLn, a plurality of emission lines EL1 to ELm, first and second control lines CSL1 and CSL2, a power line PL, and a plurality of pads PD. Here, each of "m" and "n" is a natural number. The pixels PX may be connected to the scan lines SL1 to SLm, the data lines DL1 to DLn, and the emission lines EL1 to ELm.

The scan lines SL1 to SLm may extend in the first direction DR1 and may be connected to the scan driver SDV. The data lines DL1 to DLn may extend in the second direction DR2 and may be connected to the driving chip DIC via the bending area BA. The emission lines EL1 to ELm may extend in the first direction DR1 and may be connected to the emission driver EDV.

The power line PL may include a portion extending in the first direction DR1 and a portion extending in the second direction DR2. The portion extending in the second direction DR2 and the portion extending in the first direction DR1 may be disposed on different layers from each other. The portion of the power line PL, which extends in the second direction DR2, may extend to the second area AA2 via the bending area BA. The power line PL may provide a first voltage to the pixels PX.

The first control line CSL1 may be connected to the scan driver SDV and may extend to a lower end of the second area AA2 via the bending area BA. The second control line CSL2 may be connected to the emission driver EDV and may extend to the lower end of the second area AA2 via the bending area BA.

When viewed in a plan view, the pads PD may be disposed adjacent to the lower end of the second area AA2. The driving chip DIC, the power line PL, the first control line CSL1, and the second control line CSL2 may be connected to the pads PD. The flexible circuit film FCB may be electrically connected to the pads PD through an anisotropic conductive adhesive layer.

Referring to FIG. 3B, the sensing area DP-TA may have a light transmittance higher than that of the display area DP-DA and may have a resolution lower than that of the display area DP-DA. The light transmittance and the resolution may be measured based on a unit area. A ratio of an area occupied by a light blocking structure to an entire area may be smaller in the sensing area DP-TA than in the display area DP-DA based on the unit area. The light blocking structure may include a conductive pattern of a circuit layer, an electrode of a light emitting element, and a light blocking pattern, which are described later.

The sensing area DP-TA may have the resolution lower than that of the display area DP-DA in the unit area. The number of the pixels arranged in the sensing area DP-TA may be smaller than that of the display area DP-DA in the unit area (or in an area of the same size).

In an embodiment, as shown in FIG. 3B, a first pixel PX1 may be disposed in the display area DP-DA, and a second pixel PX2 may be disposed in the sensing area DP-TA. When comparing color pixels of the first pixel PX1 with color pixels of the second pixel PX2, the color pixels having a same color in the first pixel PX1 and the second pixel PX2 may have different light emitting areas from each other. The first pixel PX1 and the second pixel PX2 may have different arrangements from each other.

FIG. 3B shows light emitting areas LA of the first pixel PX1 and the second pixel PX2 in an embodiment. Each of the light emitting areas LA may be defined as an area where an anode of the light emitting element is exposed without being covered by a pixel definition layer. In the display area DP-DA, a non-light-emitting area NLA may be defined between the light emitting areas LA.

The first pixel PX1 may include a first color pixel PX1-R, a second color pixel PX1-G, and a third color pixel PX1-B, and the second pixel PX2 may include a first color pixel PX2-R, a second color pixel PX2-G, and a third color pixel PX2-B. In an embodiment, each of the first pixel PX1 and the second pixel PX2 may include a red pixel, a green pixel, and a blue pixel, for example.

The sensing area DP-TA may include a pixel area PA, a line area BL, and a transmission area BT. The second pixel PX2 may be disposed in the pixel area PA. FIG. 3B shows an embodiment having a structure in which two first color pixels PX2-R, four second color pixels PX2-G, and two third color pixels PX2-B are disposed in one pixel area PA, however, the disclosure is not limited thereto or thereby.

In an embodiment, a conductive pattern, a signal line, or a light blocking pattern, which correspond to the second pixel PX2, may be disposed in the pixel area PA and the line area BL. The light blocking pattern may be a metal pattern and may substantially overlap the pixel area PA and the line area BL. The pixel area PA and the line area BL may be a non-transmission area.

The transmission area BT may be an area through which an optical signal passes. In an embodiment, since the second pixel PX2 is not disposed in the transmission area BT, the conductive pattern, the signal line, or the light blocking pattern may not be disposed in the transmission area BT. Accordingly, the transmission area BT may increase the light transmittance of the sensing area DP-TA.

Figure 4:
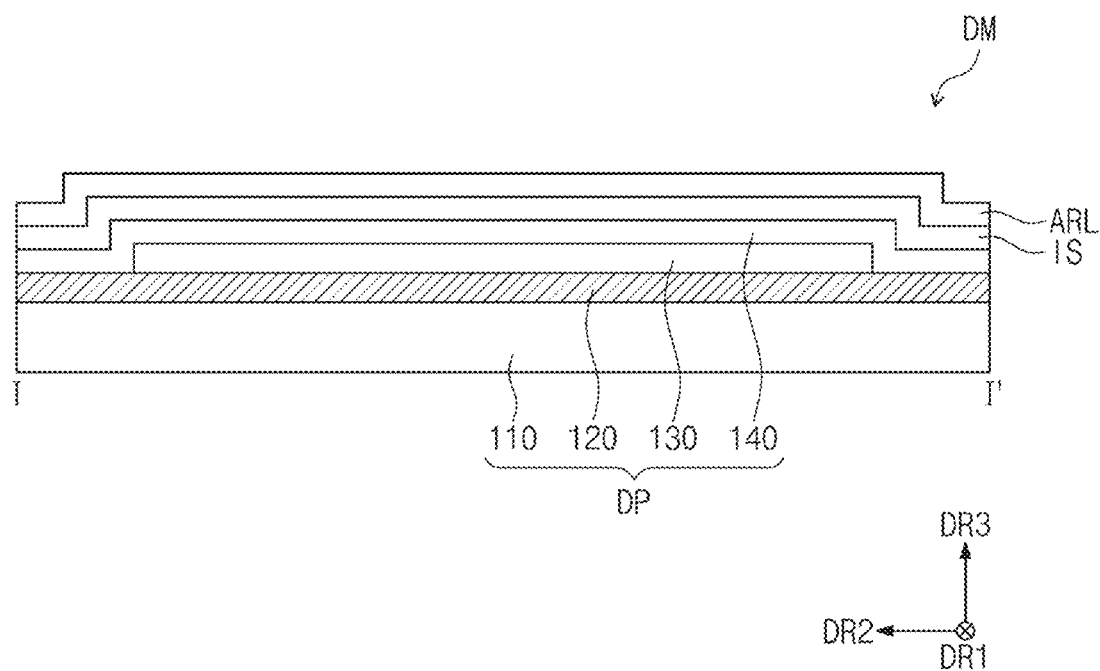
FIG. 4 is a cross-sectional view showing a display module according to an embodiment of the disclosure.

FIG. 4 is a cross-sectional view showing the display module DM according to an embodiment of the disclosure.

Referring to FIG. 4, an embodiment of the display module DM may include the display panel DP, the input sensor IS, and an anti-reflective layer ARL. The display panel DP may include a base layer 110, a circuit layer 120, a light emitting element layer 130, and an encapsulation layer 140.

The base layer 110 may provide a base surface on which the circuit layer 120 is disposed. The base layer 110 may be a flexible substrate that is bendable, foldable, or rollable. The base layer 110 may be a glass substrate, a metal substrate, or a polymer substrate, but not being limited thereto or thereby. According to an embodiment, the base layer 110 may include an inorganic layer, an organic layer, or a composite material layer.

The base layer 110 may have a multi-layer structure. In an embodiment, for example, the base layer 110 may include a first synthetic resin layer, an inorganic layer having a single-layer or multi-layer structure, and a second synthetic resin layer disposed on the inorganic layer having the single-layer or multi-layer structure. Each of the first and second synthetic resin layers may include a polyimide-based resin, but not being particularly limited.

The circuit layer 120 may be disposed on the base layer 110. The circuit layer 120 may include an insulating layer, a semiconductor pattern, a conductive pattern, and a signal line.

The light emitting element layer 130 may be disposed on the circuit layer 120. The light emitting element layer 130 may include the light emitting element. In an embodiment, for example, the light emitting element may include an organic light emitting material, an inorganic light emitting material, an organic-inorganic light emitting material, a quantum dot, a quantum rod, a micro-light emitting diode ("LED"), or a nano-LED.

The encapsulation layer 140 may be disposed on the light emitting element layer 130. The encapsulation layer 140 may protect the light emitting element layer 130 from moisture, oxygen, and a foreign substance such as dust particles. The encapsulation layer 140 may include at least one inorganic layer. The encapsulation layer 140 may have a stack structure in which an inorganic layer, an organic layer, and an inorganic layer are sequentially stacked one on another.

The input sensor IS may be disposed directly on the display panel DP. The input sensor IS may be formed with the display panel DP through successive processes. In the disclosure, the expression "the input sensor IS is disposed directly on the display panel DP" means that no intervening elements are present between the input sensor IS and the display panel DP, or that a separate adhesive member may not be disposed between the input sensor IS and the display panel DP.

The anti-reflective layer ARL may be disposed directly on the input sensor IS. The anti-reflective layer ARL may reduce a reflectance of an external light incident to the display device DD from an outside. The anti-reflective layer ARL may include color filters. The color filters may be arranged in a predetermined arrangement. In an embodiment, for example, the color filters may be arranged based on colors of lights emitted from the pixels included in the display panel DP. In an embodiment, the anti-reflective layer ARL may further include a black matrix adjacent to the color filters.

According to an embodiment, positions of the input sensor IS and the anti-reflective layer ARL may be changed with each other. According to an embodiment, the anti-reflective layer ARL may be replaced with a polarizing film. The polarizing film may be coupled with the input sensor IS using an adhesive layer.

Figure 5A:
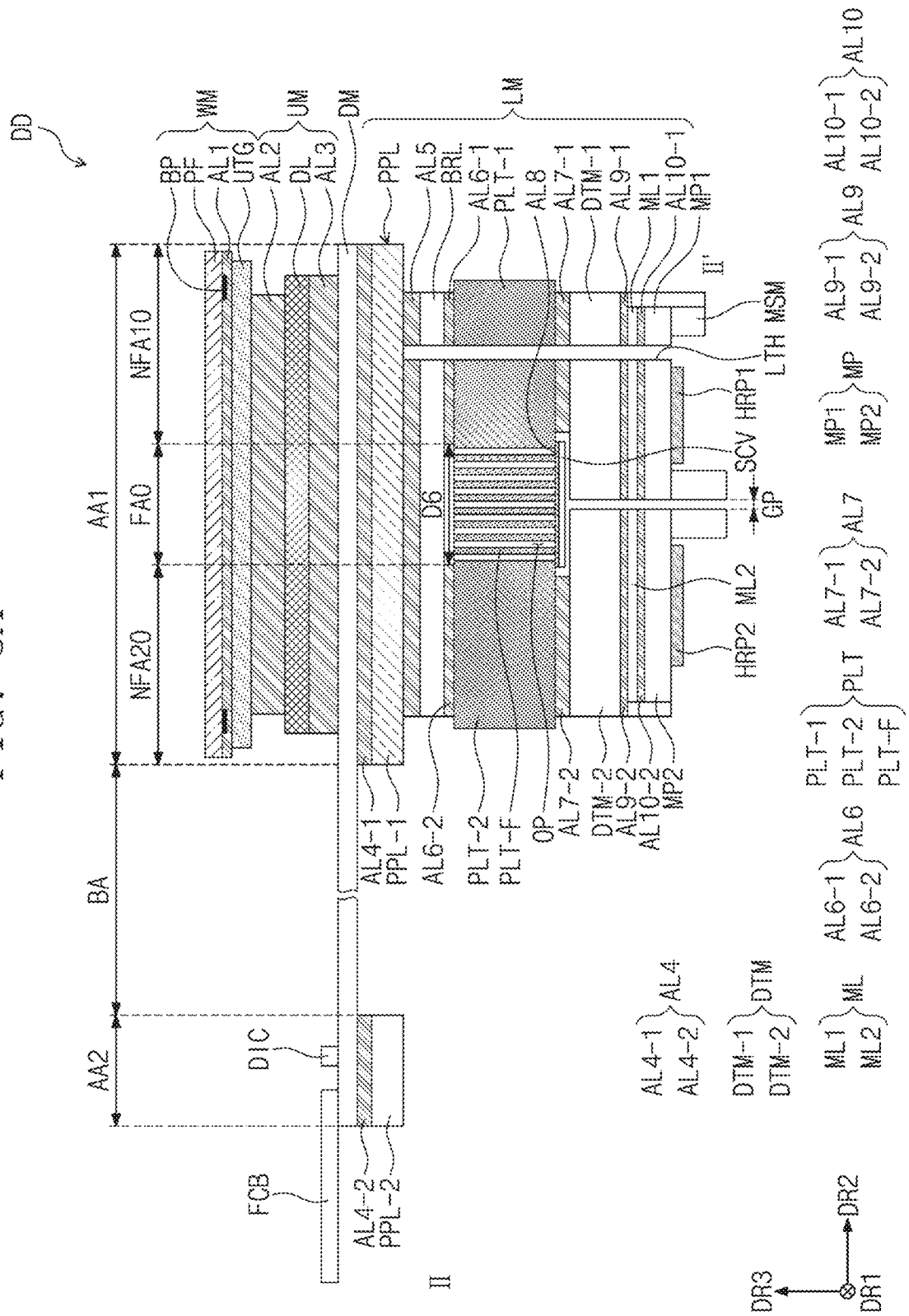
FIG. 5A is a cross-sectional view showing a display device according to an embodiment of the disclosure.
Figure 5B:
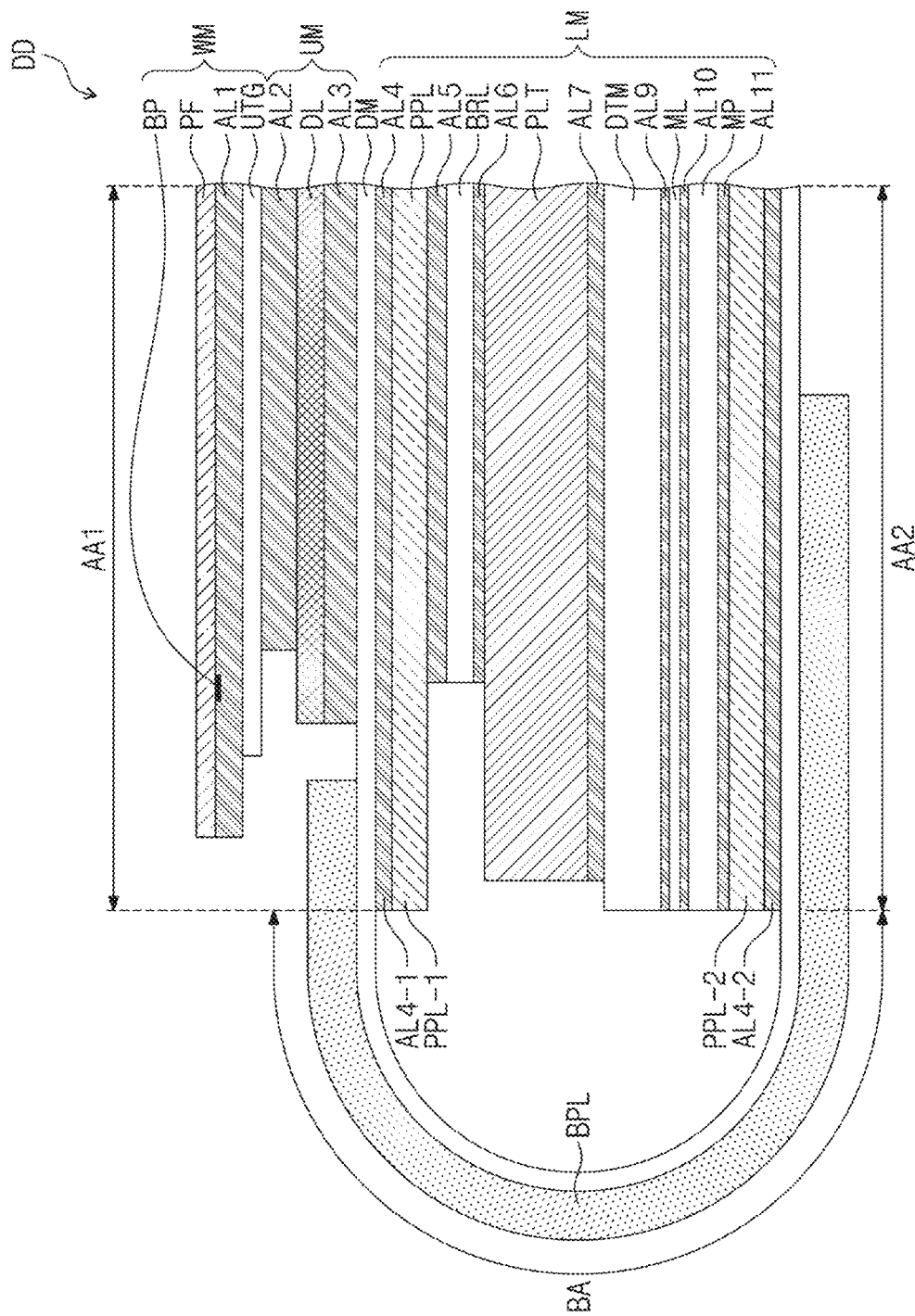
FIG. 5B is a cross-sectional view showing a display device according to an embodiment of the disclosure.

FIG. 5A is a cross-sectional view showing the display device DD according to an embodiment of the disclosure. FIG. 5B is a cross-sectional view showing the display device DD according to an embodiment of the disclosure.

FIG. 5A shows an embodiment of the display module DM in an unfolded state without being bent. FIG. 5B shows an embodiment of the display module DM of which bending area BA (refer to FIG. 3A) is bent. In FIGS. 5A and 5B, areas of the display module DM distinguished from each other are shown based on the display panel DP of FIG. 3A.

Referring to FIGS. 5A and 5B, an embodiment of the display device DD may include the window WM, an upper member UM, the display module DM, and a lower member LM. The upper module UM may be collectively defined by or refer to components disposed between the window WM and the display module DM, and the lower member LM may be collectively defined by or refer to components disposed under the display module DM.

The window WM may include a thin glass substrate UTG, a window protective layer PF disposed on the thin glass substrate UTG, and a bezel pattern BP disposed on a lower surface of the window protective layer PF. In an embodiment, the window protective layer PF may include a synthetic resin film. The window WM may include an adhesive layer AL1 (hereinafter, referred to as a first adhesive layer) that attaches the window protective layer PF to the thin glass substrate UTG.

The bezel pattern BP may overlap the non-display area DP-NDA shown in FIG. 1A. The bezel pattern BP may be disposed on one surface of the thin glass substrate UTG or one surface of the window protective layer PF. FIG. 5B shows an embodiment having a structure in which the bezel pattern BP is disposed on the lower surface of the window protective layer PF, but not being limited thereto or thereby. According to an alternative embodiment, the bezel pattern BP may be disposed on an upper surface of the window protective layer PF. The bezel pattern BP may be a colored light blocking layer and may be formed by a coating process. The bezel pattern BP may include a base material and a pigment or a dye mixed with the base material.

The thin glass substrate UTG may have a thickness in a range from about 15 micrometers (µm) to about 45 µm. The thin glass substrate UTG may be a chemically strengthened glass. The occurrence of crease in thin glass substrate UTG may be minimized even though the folding and unfolding operations are repeatedly performed.

The window protective layer PF may have a thickness in a range from about 50 µm to about 80 µm. The synthetic resin film of the window protective layer PF may include polyimide, poly carbonate, polyamide, triacetylcellulose, polymethylmethacrylate, or polyethylene terephthalate. Although not shown in figures, at least one of a hard coating layer, an anti-fingerprint layer, and an anti-reflective layer may be disposed on the upper surface of the window protective layer PF.

The first adhesive layer AL1 may be a pressure sensitive adhesive ("PSA") film or an optically clear adhesive ("OCA"). Adhesive layers described hereinafter may include a same adhesive as the first adhesive layer AL1.

The first adhesive layer AL1 may be separated from the thin glass substrate UTG. Since a strength of the window protective layer PF is lower than that of the thin glass substrate UTG, scratches may occur relatively easily on the window protective layer PF. After the first adhesive layer AL1 and the window protective layer PF are separated from each other, another window protective layer PF may be attached to the thin glass substrate UTG.

In an embodiment, when viewed in a plan view, an edge of the thin glass substrate UTG may not overlap the bezel pattern BP. In such an embodiment, the edge of the thin glass substrate UTG may be exposed without being covered by the bezel pattern BP, and fine cracks generated on the edge of the thin glass substrate UTG may be effectively inspected using an inspection device.

The upper member UM may include an upper film DL. The upper film DL may include a synthetic resin film. The synthetic resin film may include polyimide, polycarbonate, polyamide, triacetylcellulose, polymethylmethacrylate, or polyethylene terephthalate.

The upper film DL may absorb an external impact applied to the front surface of the display device DD. The display module DM may be substantially the same as that described above with reference to FIG. 4, and the display module DM may include the anti-reflective layer ARL employed instead of the polarizing film, and thus an impact resistance to external impacts applied to a front side of the display device DD may be reduced. The upper film DL may compensate for the impact resistance to the external impacts reduced by applying the anti-reflective layer ARL to the display device DD. According to an alternative embodiment, the upper film DL may be omitted. The upper member UM may include a second adhesive layer AL2 that attaches the upper film DL to the window WM and a third adhesive layer AL3 that attaches the upper film DL to the display module DM.

The lower member LM may include a panel protective layer PPL, a barrier layer BRL, a support layer PLT, a cover layer SCV, the digitizer DTM, a metal layer ML, a metal plate MP, a heat dissipation layer HRP, and fourth, fifth, sixth, seventh, eighth, ninth, and tenth adhesive layers AL4, AL5, AL6, AL7, AL8, AL9, and AL10. The fourth to tenth adhesive layers AL4 to AL10 may include an adhesive such as a PSA or an OCA. According to an embodiment, some of the above-mentioned components may be omitted. In an embodiment, for example, the metal plate MP or the heat dissipation layer HRP and adhesive layers attached thereto may be omitted.

The panel protective layer PPL may be disposed under the display panel DP. The panel protective layer PPL may protect a lower portion of the display panel DP. The panel protective layer PPL may include a flexible synthetic resin film. In an embodiment, For example, the panel protective layer PPL may include polyethylene terephthalate.

According to an embodiment, the panel protective layer PPL may not be disposed in the bending area BA. The panel protective layer PPL may include a first panel protective layer PPL-1 that protects the first area AA1 of the display panel DP (refer to FIG. 3A) and a second panel protective layer PPL-2 that protects the second area AA2 of the display panel DP (refer to FIG. 3A).

The fourth adhesive layer AL4 may attach the panel protective layer PPL to the display panel DP. The fourth adhesive layer AL4 may include a first portion AL4-1 corresponding to the first panel protective layer PPL-1 and a second portion AL4-2 corresponding to the second panel protective layer PPL-2.

In an embodiment, as shown in FIG. 5B, when the bending area BA is bent, the second panel protective layer PPL-2 may be disposed under the first area AA1 and the first panel protective layer PPL-1 with the second area AA2. Since the panel protective layer PPL is not disposed in the bending area BA, the bending area BA may be more easily bent. The second panel protective layer PPL-2 may be attached to the metal plate MP by an eleventh adhesive layer AL11. In an alternative embodiment, the eleventh adhesive layer AL11 may be omitted. Although not shown in figures, an additional element such as an insulating tape may be further disposed between the second panel protective layer PP1-2 and the metal plate MP.

As shown in FIG. 5B, the bending area BA may have a predetermined curvature and a predetermined radius of curvature. The radius of curvature may be within a range from about 0.1 millimeter (mm) to about 0.5 mm. The bending protective layer BPL may be disposed at least in the bending area BA. The bending protective layer BPL may overlap the bending area BA, the first area AA1, and the second area AA2. The bending protective layer BPL may be disposed on a portion of the first area AA1 and a portion of the second area AA2.

The bending protective layer BPL may be bent with the bending area BA. The bending protective layer BPL may protect the bending area BA from the external impact and may control a neutral surface of the bending area BA. The bending protective layer BPL may control stress of the bending area BA in a way such that the neutral surface is defined close to a plane on which the signal lines are arranged in the bending area BA.

In an embodiment, as shown in FIGS. 5A and 5B, the fifth adhesive layer AL5 may attach the panel protective layer PPL to the barrier layer BRL. The barrier layer BRL may be disposed under the panel protective layer PPL. The barrier layer BRL may increase a resistance against a compressive force caused by external pressure force. Accordingly, the barrier layer BRL may effectively prevent the display panel DP from being deformed. The barrier layer BRL may include a flexible plastic material, such as polyimide or polyethylene terephthalate. In an embodiment, the barrier layer BRL may be a colored film with low light transmittance. The barrier layer BRL may absorb a light incident thereto from the outside. In an embodiment, for example, the barrier layer BRL may be a black synthetic resin film. When looking at the display device DD from an upper side of the window protective layer PF or in the third direction DR3, components disposed under the barrier layer BRL may not be viewed by the user.

The sixth adhesive layer AL6 may attach the barrier layer BRL to the support layer PLT. The sixth adhesive layer AL6 may include a first portion AL6-1 and a second portion AL6-2 separated from the first portion AL6-1. A distance D6 (or an interval) between the first portion AL6-1 and the second portion AL6-2 may correspond to a width of the folding area FAO and may be greater than a gap GP between a first digitizer DTM-1 and a second digitizer DTM-2 to be described later. The distance D6 between the first portion AL6-1 and the second portion AL6-2 may be within a range from about 7 mm to about 15 mm, preferably, from about 9 mm to about 13 mm.

In an embodiment, the first portion AL6-1 and the second portion AL6-2 may be defined as different portions of one adhesive layer, but not being limited thereto or thereby. When the first portion AL6-1 is defined as one adhesive layer, e.g., a first adhesive layer or a second adhesive layer, the second portion AL6-2 may be defined as another adhesive layer, e.g., a second adhesive layer or a third adhesive layer. The above-described definitions may be applied not only to the sixth adhesive layer AL6 but also to adhesive layers including two portions among adhesive layers described later.

The support layer PLT may be disposed under the barrier layer BRL. The support layer PLT may support components disposed on the support layer and may maintain the unfolded state and the folded state of the display device DD. The support layer PLT may have a strength higher than that of the barrier layer BRL. The support layer PLT may include a first support portion PLT-1 corresponding to the first non-folding area NFA10 and a second support portion PLT-2 corresponding to the second non-folding area NFA20. The first support portion PLT-1 and the second support portion PLT-2 may be spaced apart from each other in the second direction DR2.

The support layer PLT may include a folding portion PLT-F corresponding to the folding area FAO and disposed between the first support portion PLT-1 and the second support portion PLT-2, and a plurality of openings OP is defined through the folding portion PLT-F. The openings OP may be arranged to allow the folding area FAO to have a lattice shape when viewed in a plan view. The first support portion PLT-1, the second support portion PLT-2, and the folding portion PLT-F may be provided integrally with each other or integrally formed with each other as a single unitary unit.

The folding portion PLT-F may prevent a foreign substance from entering a center area of the barrier layer BRL, which is not covered by the first support portion PLT-1 and the second support portion PLT-2, during the folding operation shown in FIGS. 1B and 1C. Due to the openings OP, a flexibility of the folding portion PLT-F may be improved. In addition, since the sixth adhesive layer AL6 is not disposed in the folding portion PLT-F, a flexibility of the support layer PLT may be improved. According to an alternative embodiment, the folding portion PLT-F may be omitted. In such an embodiment, the support layer PLT may include the first support portion PLT-1 and the second support portion PLT-2 spaced apart from the first support portion PLT-1.

The support layer PLT may include at least one material selected from materials that transmit an electromagnetic field generated by the digitizer DTM described below without loss or with minimal loss. The support layer PLT may include a non-metallic material. The support layer PLT may include a reinforced fiber composite. The support layer PLT may include a reinforced fiber disposed in a matrix portion. The reinforced fiber may be a carbon fiber or a glass fiber. The matrix portion may include a polymer resin. The matrix portion may include a thermoplastic resin. In an embodiment, for example, the matrix portion may include a polyamide-based resin or a polypropylene-based resin. In an embodiment, for example, the reinforced fiber composite may be a carbon fiber reinforced plastic ("CFRP") or a glass fiber reinforced plastic ("GFRP").

The cover layer SCV and the digitizer DTM may be disposed under the support layer PLT. The cover layer SCV may be disposed to overlap the folding area FAO. The digitizer DTM may include a first digitizer DTM-1 and a second digitizer DTM-2, which respectively overlap the first support portion PLT-1 and the second support portion PLT-2. A portion of the first digitizer DTM-1 and a portion of the second digitizer DTM-2 may be disposed under the cover layer SCV.

The seventh adhesive layer AL7 may attach the support layer PLT to the cover layer SCV, and the eighth adhesive layer AL8 may attach the cover layer SCV to the support layer PLT. The seventh adhesive layer AL7 may include a first portion AL7-1 that attaches the first support portion PLT-1 to the first digitizer DTM-1 and a second portion AL7-2 that attaches the second support portion PLT-2 to the second digitizer DTM-2.

The cover layer SCV may be disposed between the first portion AL7-1 and the second portion AL7-2 in the second direction DR2. The cover layer SCV may be spaced apart from the digitizer DTM to prevent interference with the digitizer DTM in the unfolded state. A sum of a thickness of the cover layer SCV and a thickness of the eighth adhesive layer AL8 may be smaller than a thickness of the seventh adhesive layer AL7.

The cover layer SCV may cover the openings OP of the folding portion PLT-F. The cover layer SCV may have an elastic modulus smaller than that of the support layer PLT. In an embodiment, for example, the cover layer SCV may include thermoplastic polyurethane, rubber, or silicone, but not being limited thereto or thereby.

The digitizer DTM may be referred to as an electromagnetic resonance ("EMR") sensing panel and may include a plurality of loop coils for generating a magnetic field with the electronic pen at a predetermined resonant frequency. The magnetic field generated by the loop coils may be applied to an LC resonant circuit formed by an inductor (coil) and a capacitor of the electronic pen. The coil may generate a current in response to the magnetic field applied thereto and may supply the generated current to the capacitor. Accordingly, the capacitor may be charged with the current supplied thereto from the coil and may discharge the charged current to the coil. Consequently, the magnetic field of the resonant frequency may be emitted from the coil. The magnetic field emitted by the electronic pen may be absorbed by the loop coils of the digitizer, and thus, it is possible to determine a position in a touch screen to which the electronic pen gets close.

The first digitizer DTM-1 and the second digitizer DTM-2 may be disposed to be spaced apart from each other by the gap GP. The gap GP may be within a range from about 0.3 mm to about 3 mm and may be defined to correspond to the folding area FAO. The digitizer DTM will be described later in detail later.

The metal layer ML may be disposed under the digitizer DTM. The metal layer ML may include a first metal layer ML1 and a second metal layer ML2, which respectively overlap the first support portion PLT-1 and the second support portion PLT-2. The metal layer ML may dissipate heat generated when the digitizer DTM is driven to the outside. The metal layer ML may transfer the heat generated by the digitizer DTM in a downward direction. The metal layer ML may have an electrical conductivity and a thermal conductivity, which are higher than those of the metal plate described later. The metal layer ML may include copper or aluminum. The metal layer ML having the relatively high electrical conductivity may prevent the electromagnetic wave generated by the electronic module EM (refer to FIG. 2A) disposed thereunder from exerting influence on the digitizer DTM as noise.

The ninth adhesive layer AL9 may attach the digitizer DTM to the metal layer ML. The ninth adhesive layer AL9 may include a first portion AL9-1 and a second portion AL9-2, which respectively correspond to the first metal layer ML1 and the second metal layer ML2.

The metal plate MP may be disposed under the metal layer ML. The metal plate MP may include a first metal plate MP1 and a second metal plate MP2, which respectively overlap the first metal layer ML1 and the second metal layer ML2. The metal plate MP may absorb the external impact applied thereto from a lower side.

The metal plate MP may have a strength higher than that of the metal layer ML and may have a thickness greater than that of the metal layer ML. The metal plate MP may include a metal material such as stainless steel.

The tenth adhesive layer AL10 may attach the metal layer ML to the metal plate MP. The tenth adhesive layer AL10 may include a first portion AL10-1 and a second portion AL10-2, which respectively correspond to the first metal plate MP1 and the second metal plate MP2.

The heat dissipation layer HRP may be disposed under the metal plate MP. The heat dissipation layer HRP may include a first heat dissipation layer HRP1 and a second heat dissipation layer HRP2, which respectively overlap the first metal plate MP1 and the second metal plate MP2. The heat dissipation layer HRP may dissipate heat generated from electronic components disposed thereunder. The electronic components may be substantially the same as the electronic module EM shown in FIGS. 2A and 2B. The heat dissipation layer HRP may have a structure in which an adhesive layer and a graphite layer are alternately stacked with each other. An outermost adhesive layer may be attached to the metal plate MP.

A magnetic field shielding sheet MSM may be disposed under the metal plate MP. The magnetic field shielding sheet MSM may shield a magnetic field generated from a magnetic substance (not shown) disposed thereunder. The magnetic field shielding sheet MSM may prevent the magnetic field generated from the magnetic substance from interfering with the digitizer DTM.

The magnetic field shielding sheet MSM may include a plurality of portions. At least some portions of the portions may have different thicknesses from the other portions. The portions may be disposed to correspond to a step difference of a bracket (not shown) disposed under the display device DD. The magnetic field shielding sheet MSM may have a structure in which a magnetic field shielding layer and an adhesive layer are alternately stacked with each other. A portion of the magnetic field shielding sheet MSM may be directly attached to the metal plate MP.

In an embodiment, a through hole LTH may be defined through some members of the lower member LM. The through hole LTH may be defined to overlap the sensing area DP-TA of FIG. 2A. In an embodiment, as shown in FIG. 5A, the through hole LTH may penetrate from the fifth adhesive layer AL5 to the metal plate MP. In such an embodiment where the through hole LTH is provided, the light blocking structure may be removed from a path of the optical signal, and the through hole LTH may improve an optical signal reception efficiency of the electro-optical module ELM.

Figure 6A:
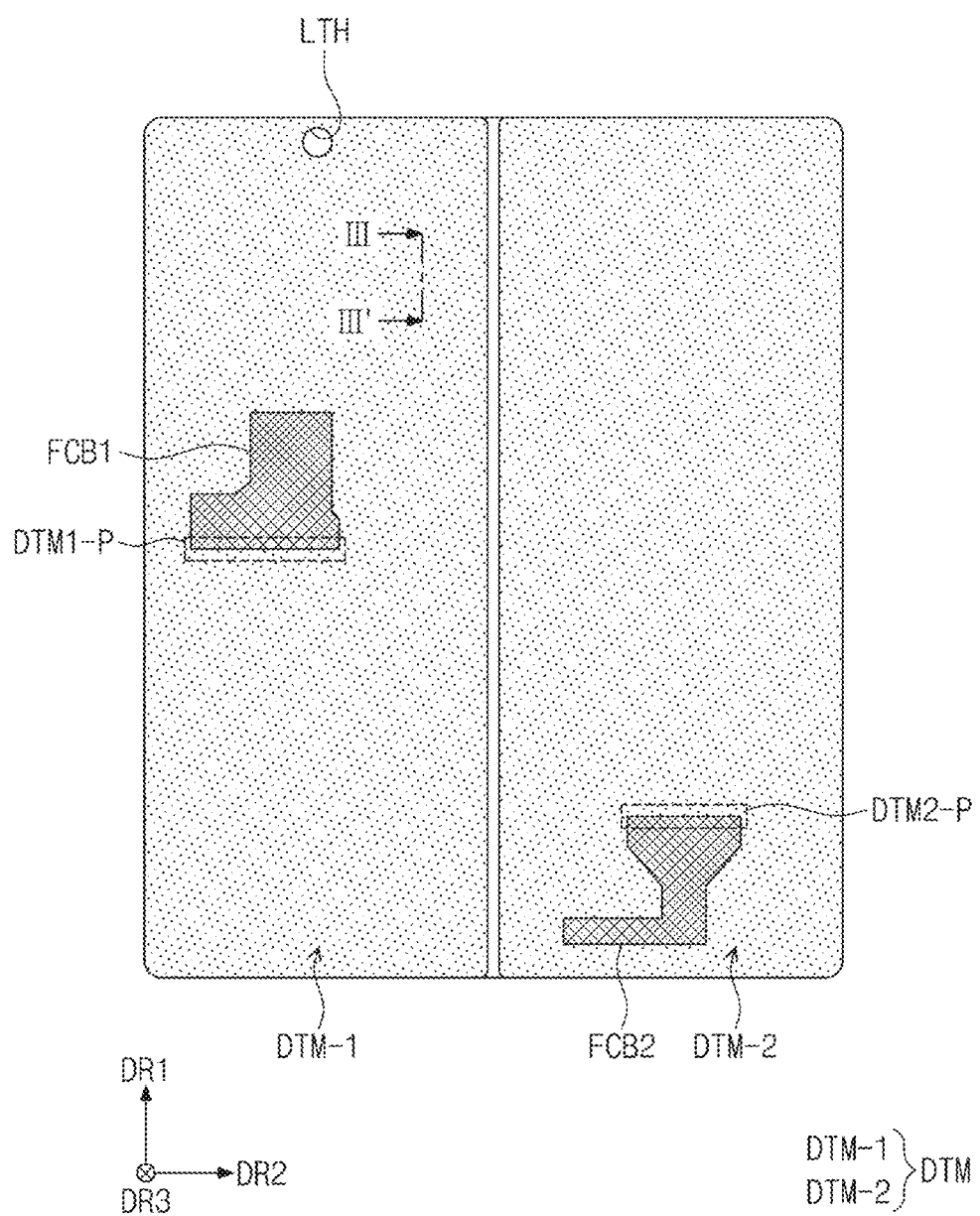
FIG. 6A is a plan view showing a digitizer according to an embodiment of the disclosure.
Figure 6B:
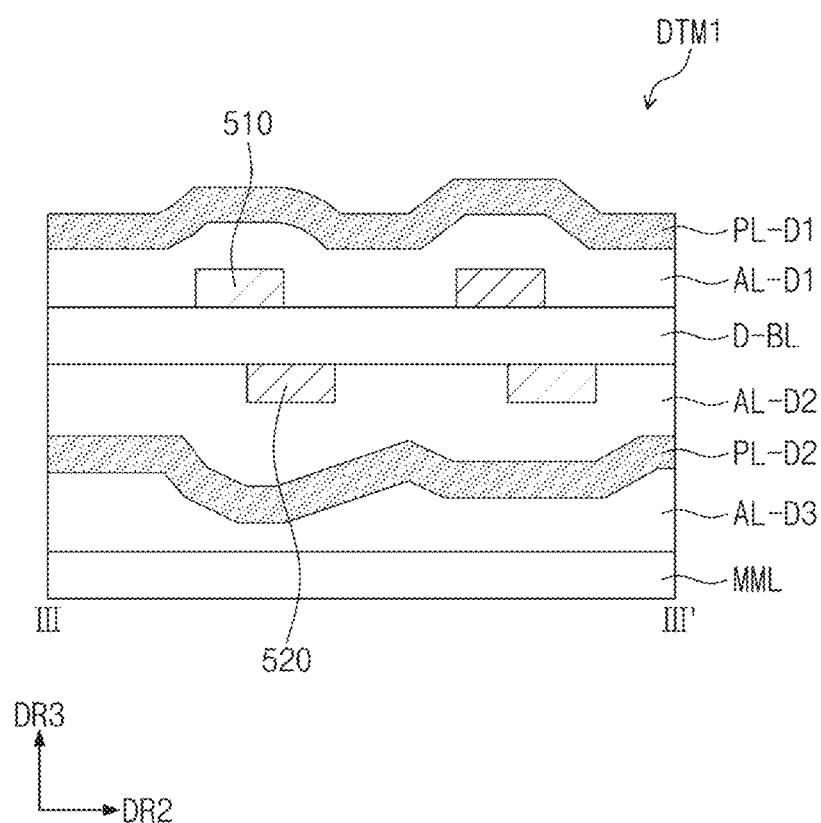
FIG. 6B is a cross-sectional view showing a digitizer according to an embodiment of the disclosure.
Figure 6C:
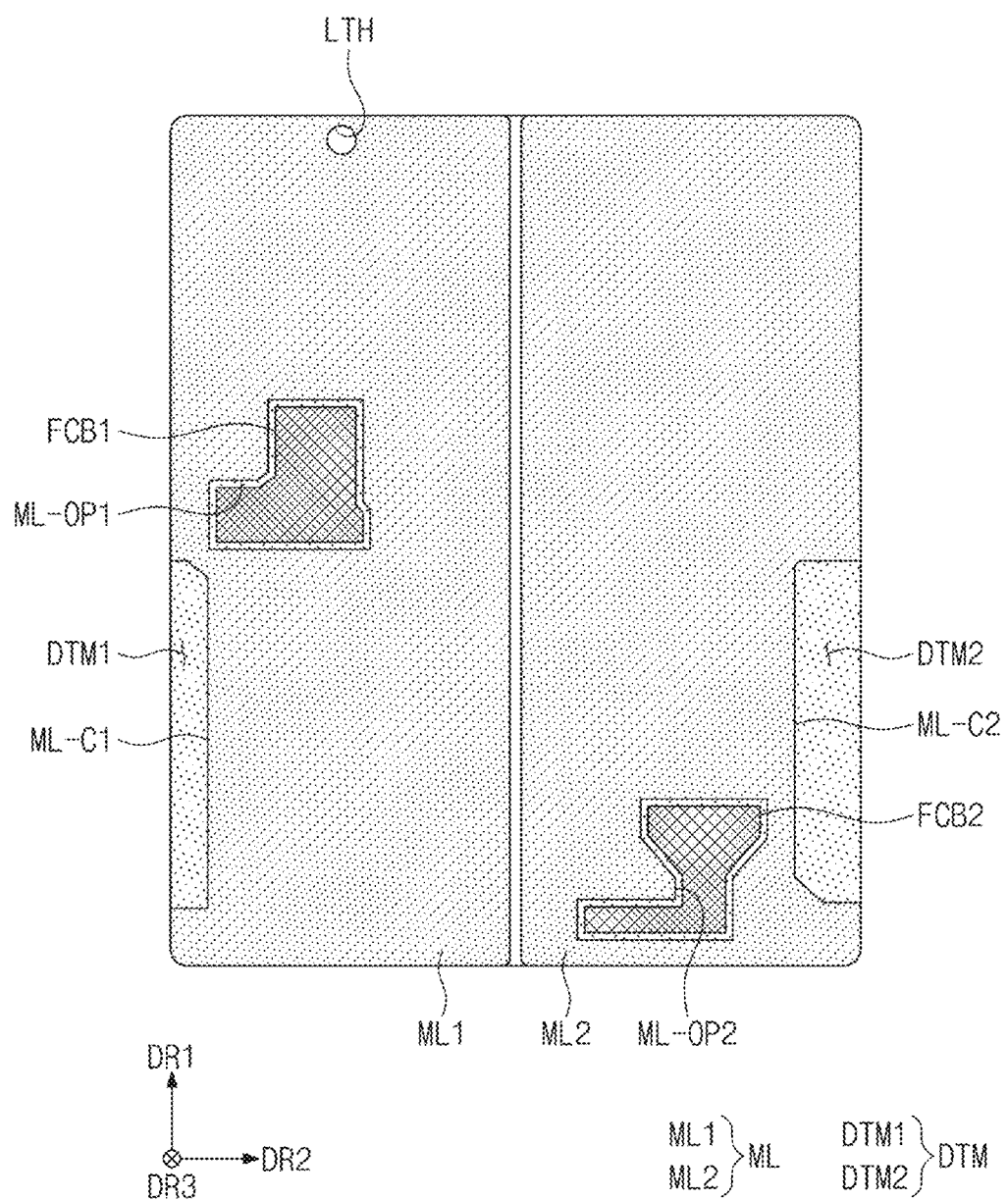
FIG. 6C is a plan view showing a metal layer according to an embodiment of the disclosure.
Figure 6D:
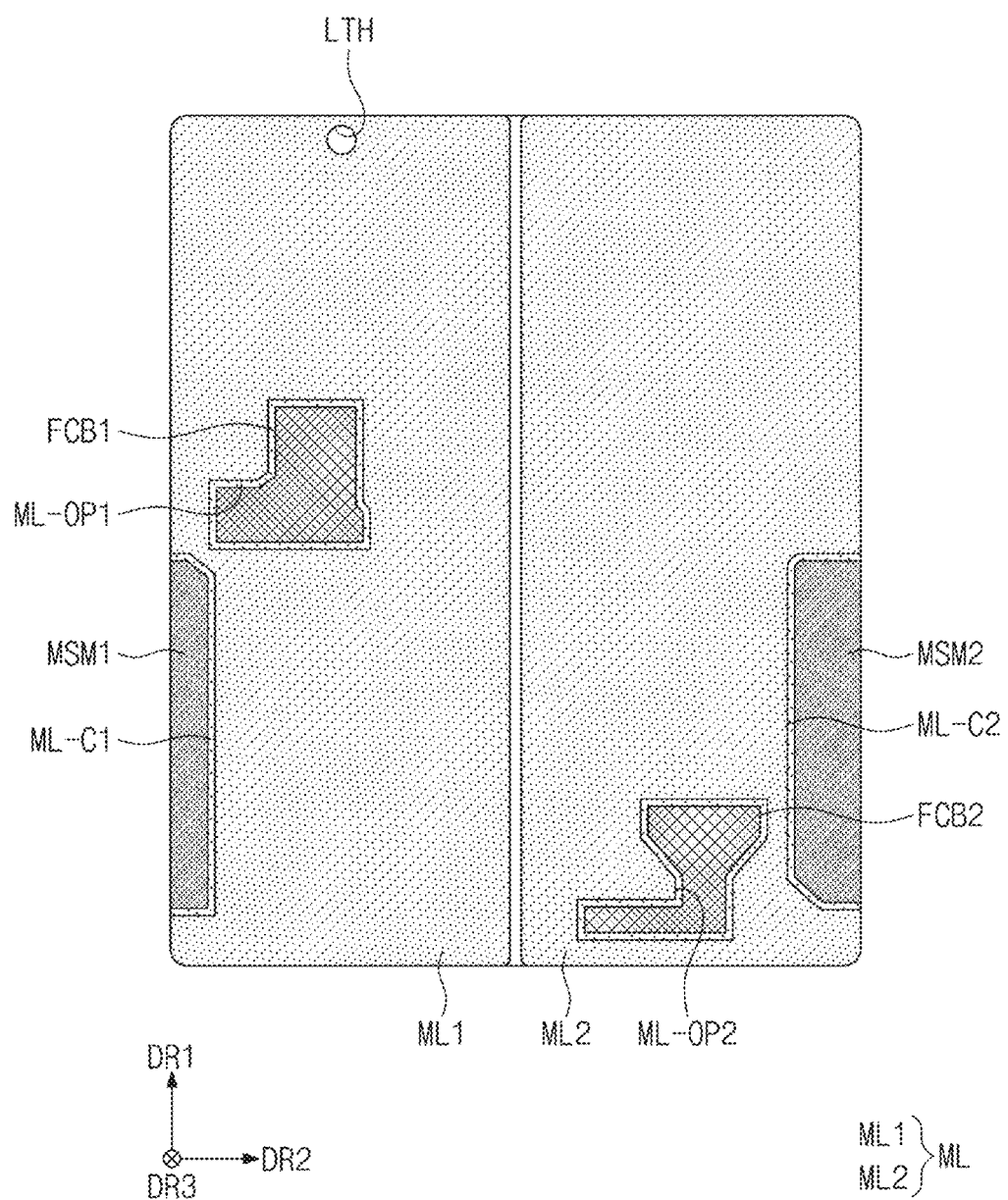
FIG. 6D is a plan view showing a magnetic field shielding sheet disposed in cut-away portions of the metal layer according to an embodiment of the disclosure.
Figure 6E:
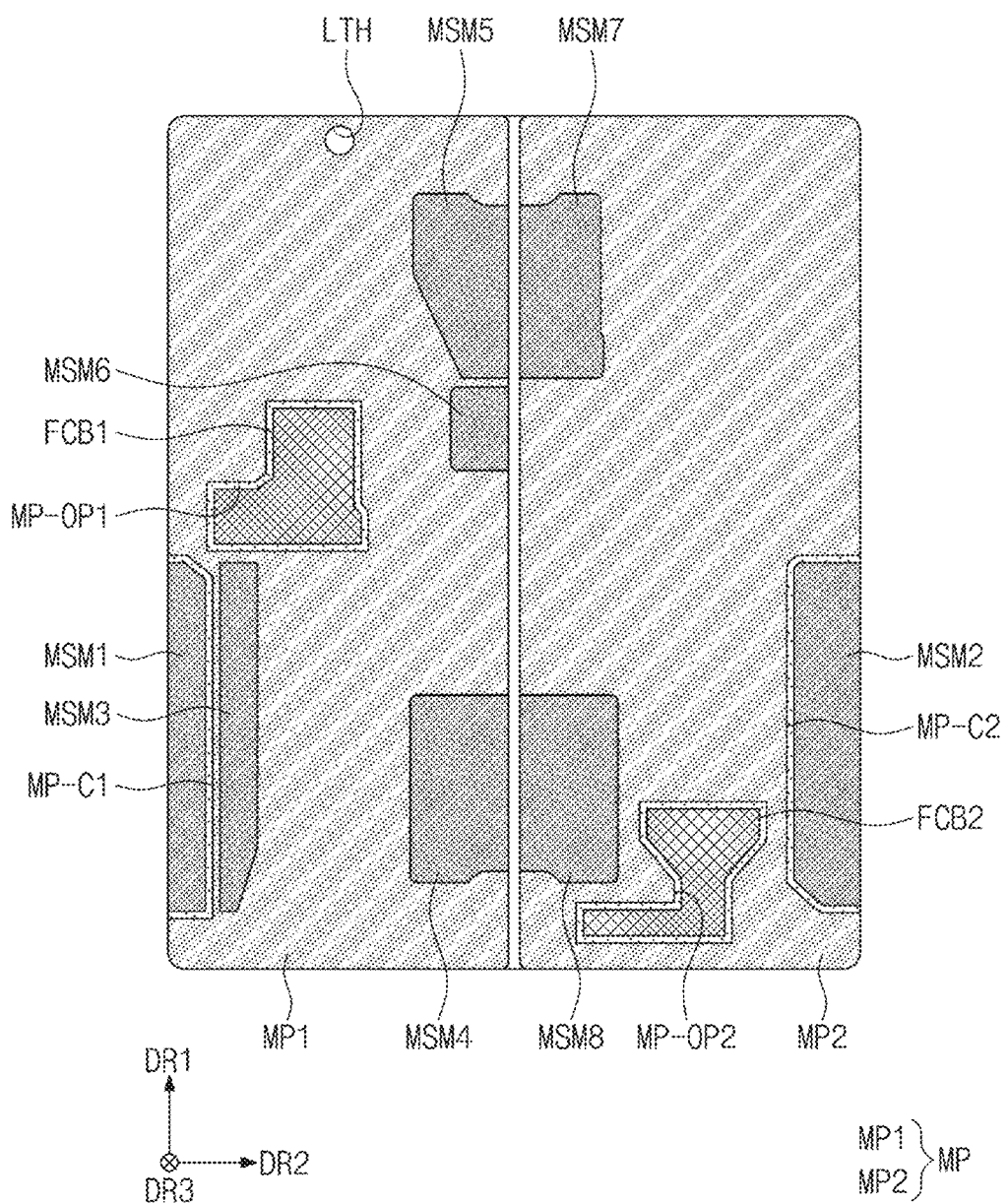
FIG. 6E is a plan view showing a metal plate according to an embodiment of the disclosure.

FIG. 6A is a plan view showing the digitizer DTM according to an embodiment of the disclosure. FIG. 6B is a cross-sectional view showing the digitizer DTM according to an embodiment of the disclosure. FIG. 6C is a plan view showing the metal layer ML according to an embodiment of the disclosure. FIG. 6D is a plan view showing the magnetic field shielding sheet MLM disposed in cut-away portions ML-C1 and ML-C2 of the metal layer ML according to an embodiment of the disclosure. FIG. 6E is a plan view showing the metal plate MP according to an embodiment of the disclosure. FIGS. 6A and 6C to 6E show embodiments in a state in which the display device DD shown in FIG. 5A is turned upside down.

Referring to FIG. 6A, in an embodiment, the digitizer DTM may include the first digitizer DTM-1 and the second digitizer DTM-2 spaced apart from the first digitizer DTM-1. The first digitizer DTM-1 and the second digitizer DTM-2 may be electrically connected to a first flexible circuit board FCB1 and a second flexible circuit board FCB2, respectively. The first flexible circuit board FCB1 and the second flexible circuit board FCB2 may electrically connect the first digitizer DTM-1 and the second digitizer DTM-2 to the main circuit board, respectively.

Each of the first digitizer DTM-1 and the second digitizer DTM-2 may include a plurality of first loop coils and a plurality of second loop coils. The first loop coils may be referred to as driving coils, and the second loop coils may be referred to as sensing coils. The first loop coils may be disposed in a layer different from a layer in which the second loop coils are disposed.

The stack structure of the digitizer DTM will be described in detail with reference to FIG. 6B based on a cross-section of the first digitizer DTM-1. FIG. 6B shows the cross-section of the first digitizer DTM-1 disposed in a same state as in the display device DD shown in FIG. 5A. The first digitizer DTM-1 and the second digitizer DTM-2 may have a same stack structure as each other.

The first digitizer DTM-1 may include a base layer D-BL, the first loop coils 510 disposed on one surface of the base layer D-BL, and the second loop coils 520 disposed on an opposing surface of the base layer D-BL, which is opposite to the one surface of the base layer D-BL. The base layer D-BL may include a synthetic resin film, e.g., a polyimide film. The first loop coils 510 and the second loop coils 520 may include a metal material, such as gold (Au), silver (Ag), copper (Cu), aluminum (Al), or the like.

Protective layers may be disposed above the one surface and the opposing surface of the base layer D-BL to protect the first loop coils 510 and the second loop coils 520, respectively. A first protective layer PL-D1 may be disposed above the first loop coils 510 and may be attached to the one surface of the base layer D-BL by a first adhesive layer AL-D1. A second protective layer PL-D2 may be disposed above the second loop coils 520 and may be attached to the opposing surface of the base layer D-BL by a second adhesive layer AL-D2. The protective layers may include a synthetic resin film, e.g., a polyimide film.

In an embodiment, as described above, since the support layer PLT has an insulating property, an electromagnetic field generated from the first loop coils 510 or the second loop coils 520 may pass through the support layer PLT. The digitizer DTM disposed under the support layer PLT may sense an external input.

An electromagnetic shielding layer MML may be disposed under the second protective layer PL-D2. The electromagnetic shielding layer MML may prevent an electromagnetic wave generated from the electronic module EM (refer to FIG. 2A) disposed thereunder from exerting influence on the digitizer DTM as noise.

The electromagnetic shielding layer MML may be attached to the second protective layer PL-D2 by a third adhesive layer AL-D3. The electromagnetic shielding layer MML may include a magnetic metal powder. According to an alternative embodiment, the electromagnetic shielding layer MML may be omitted.

Referring back to FIG. 6A, an opening may be defined through the first digitizer DTM-1 to correspond to the through hole LTH of FIG. 5A. The first flexible circuit board FCB1 may be coupled to a pad area DTM1-P of the first digitizer DTM-1, and the second flexible circuit board FCB2 may be coupled to a pad area DTM2-P of the second digitizer DTM-2. Each of the flexible circuit boards FCB1 and FCB2 may be electrically connected to a corresponding pad area among the pad areas DTM1-P and DTM2-P via an anisotropic conductive adhesive layer.

The pad area DTM1-P of the first digitizer DTM-1 may be defined as an area in which ends of the first loop coils and ends of the second loop coils are arranged or an area in which ends of signal lines connected to the first loop coils and the second loop coils are arranged. The pad area DTM2-P of the second digitizer DTM-2 may also be defined as an area in which ends of the first loop coils and ends of the second loop coils are arranged or an area in which ends of signal lines connected to the first loop coils and the second loop coils are arranged.

Referring to FIG. 6C, the first metal layer ML1 may be disposed on the first digitizer DTM-1, and the second metal layer ML2 may be disposed on the second digitizer DTM-2. In an embodiment, an opening ML-OP1 is defined through the first metal layer ML1 to expose the first flexible circuit board FCB1. The opening ML-OP1 may correspond to a path to connect the first flexible circuit board FCB1 to the main circuit board. In such an embodiment, an opening ML-OP2 may be defined through the second metal layer ML2 to expose the second flexible circuit board FCB2.

The cut-away portions ML-C1 and ML-C2 may be respectively defined in the first metal layer ML1 and the second metal layer ML2. In an embodiment, as shown in FIG. 6D, a first magnetic field shielding sheet MSM1 may be disposed in the cut-away portion ML-C1 of the first metal layer ML1, and a second magnetic field shielding sheet MSM2 may be disposed in the cut-away portion ML-C2 of the second metal layer ML2. The first magnetic field shielding sheet MSM1 may be attached to the first digitizer DTM-1, and the second magnetic field shielding sheet MSM2 may be attached to the second digitizer DTM-2.

Referring to FIG. 6E, the first metal plate MP1 may be disposed on the first metal layer ML1, and the second metal plate MP2 may be disposed on the second metal layer ML2. In an embodiment, an opening MP-OP1 may be defined through the first metal plate MP1 to correspond to the opening ML-OP1 (refer to FIG. 6D) of the first metal layer ML1, and an opening MP-OP2 may be defined through the second metal plate MP2 to correspond to the opening ML-OP2 (refer to FIG. 6D) of the second metal layer ML2. In an embodiment, a cut-away portion MP-C1 may be defined in the first metal plate MP1 to correspond to the cut-away portion ML-C1 (refer to FIG. 6D) of the first metal layer ML1, and a cut-away portion MP-C2 may be defined in the second metal plate MP2 to correspond to the cut-away portion ML-C2 (refer to FIG. 6D) of the second metal layer ML2.

In an embodiment, an opening may be defined through the first metal plate MP1 to correspond to the through hole LTH. Third, fourth, fifth, and sixth magnetic field shielding sheets MSM3, MSM4, MSM5, and MSM6 may be disposed on the first metal plate MP1, and a seventh magnetic field shielding sheet MSM7 and an eighth magnetic field shielding sheet MSM8 may be disposed on the second metal plate MP2.

Referring to FIGS. 5A, 5B, and 6A to 6E, edges of the digitizer DTM, the metal layer ML, the metal plate MP, and the adhesive layers AL9 and AL10 disposed between the digitizer DTM, the metal layer ML, and the metal plate MP are aligned with each other in most areas. Outer edges of the digitizer DTM, the metal layer ML, the metal plate MP, and the adhesive layers AL9 and AL10 disposed between the digitizer DTM, the metal layer ML, and the metal plate MP are aligned with each other in all areas except areas corresponding to the cut-away portion ML-C1 of the first metal layer ML1 and the cut-away portion ML-C2 of the second metal layer ML2. The metal layer ML to which the adhesive layer AL9 is attached and the metal plate MP to which the adhesive layer AL10 is attached may be successively stacked on the digitizer DTM, and the stack structure may be cut by a laser beam. Then, the stack structure that is cut may be attached to the support layer PLT of FIGS. 5A and 5B.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A foldable display device comprising:
   a display panel comprising a first non-folding area, a second non-folding area, and a folding area disposed between the first non-folding area and the second non-folding area; and
   a lower member disposed under the display panel,
   wherein the lower member comprises:
   a support layer under the display panel;
   a digitizer disposed under the support layer, wherein the digitizer has a digitizer opening overlapping the first non-folding area;
   a metal layer disposed under the digitizer, wherein the metal layer has a first metal opening, through which the digitizer is exposed, and a second metal opening which overlaps the digitizer opening, and
   wherein the first metal opening is spaced apart from the second metal opening in a plan view.

2. The foldable display device of claim 1, wherein the lower member further comprises a flexible circuit board electrically connected to the digitizer and disposed under the digitizer.

3. The foldable display device of claim 1, wherein the lower member further comprises a metal plate disposed under the metal layer, and
   the metal plate has a plate opening overlaps the second metal opening.

4. The foldable display device of claim 3, wherein the metal layer has an electrical conductivity greater than an electrical conductivity of the metal plate.

5. The foldable display device of claim 3, wherein the metal plate has a thickness greater than a thickness of the metal layer and a strength greater than a strength of the metal layer.

6. The foldable display device of claim 3, wherein the lower member further comprises a heat dissipation layer disposed under the metal plate.

7. The foldable display device of claim 3, wherein the metal layer has a first cut-away portion, and
   the metal plate has a second cut-away portion overlapping the first cut-away portion.

8. The foldable display device of claim 7, wherein the lower member further comprises a magnetic field shielding sheet disposed in the first cut-away portion.

9. The foldable display device of claim 8, wherein the magnetic field shielding sheet is attached to the digitizer.

10. The foldable display device of claim 1, wherein the support layer comprises a reinforced fiber composite.

11. The foldable display device of claim 1, wherein the support layer comprises:
    a first support portion corresponding to the first non-folding area;
    a second support portion corresponding to the second non-folding area; and
    a folding portion disposed between the first support portion and the second support portion, wherein a plurality of openings is defined through the folding portion.

12. The foldable display device of claim 11, wherein the lower member further comprises:
    a barrier layer overlapping the folding portion, the first support portion, and the second support portion;
    a first adhesive layer which attaches the barrier layer to an upper surface of the first support portion and an upper surface of the second support portion; and
    a second adhesive layer which attaches a lower surface of the first support portion to the digitizer.

13. The foldable display device of claim 12, wherein the lower member further comprises a cover layer attached to a lower surface of the folding portion and spaced apart from the digitizer.

14. The foldable display device of claim 12, wherein the first adhesive layer comprises:
   a first portion attached to the upper surface of the first support portion; and
   a second portion attached to the upper surface of the second support portion and spaced apart from the first support portion.

15. The foldable display device of claim 12, wherein the lower member further comprises a panel protective layer disposed between a lower surface of the display panel and the barrier layer.

16. A foldable phone comprising:
   a display panel comprising a first non-folding area, a second non-folding area, and a folding area disposed between the first non-folding area and the second non-folding area;
   a lower member disposed under the display panel, and
   a camera module disposed under the lower member;
   wherein the lower member comprises:
   a support layer overlapping the first non-folding area;
   a digitizer disposed under the support layer in the first non-folding area; and
   a metal layer disposed under the digitizer, wherein the metal layer has a metal opening through the digitizer is exposed,
   wherein an opening is defined to pass through at least a portion of the lower member, and
   the opening overlaps the camera module and is spaced apart from the metal opening in a plan view.

17. The foldable phone of claim 16, wherein the opening passes through the support layer, the digitizer, and the metal layer.

18. The foldable phone of claim 16, wherein the display panel comprises a sensing area through which an optical signal passes and a display area adjacent to the sensing area, and
   the opening is aligned with the sensing area.

19. The foldable phone of claim 18, wherein the display panel comprises:
   a first pixel disposed in the display area; and
   a second pixel disposed in the sensing area, and
   wherein the display area has a resolution higher than a resolution of the sensing area.

20. The foldable phone of claim 16, wherein the lower member further comprises a flexible circuit board disposed under the metal layer, and
   the flexible circuit board is electrically connected to the digitizer through the metal opening.

* * * * *